(12) United States Patent
Kuramoto et al.

(10) Patent No.: US 10,700,497 B2
(45) Date of Patent: Jun. 30, 2020

(54) OPTICAL SEMICONDUCTOR DEVICE

(71) Applicant: SONY CORPORATION, Tokyo (JP)

(72) Inventors: Masaru Kuramoto, Kanagawa (JP); Noriyuki Futagawa, Kanagawa (JP); Tatsushi Hamaguchi, Kanagawa (JP); Shoichiro Izumi, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/143,867

(22) Filed: Sep. 27, 2018

(65) Prior Publication Data

US 2019/0027900 A1 Jan. 24, 2019

Related U.S. Application Data

(63) Continuation of application No. 15/535,142, filed as application No. PCT/JP2015/078087 on Oct. 2, 2015, now Pat. No. 10,109,984.

(30) Foreign Application Priority Data

Dec. 26, 2014 (JP) .................. 2014-264732

(51) Int. Cl.
*H01L 33/06* (2010.01)
*H01S 5/343* (2006.01)
(Continued)

(52) U.S. Cl.
CPC ...... *H01S 5/34333* (2013.01); *H01L 21/0254* (2013.01); *H01L 21/0262* (2013.01);
(Continued)

(58) Field of Classification Search
CPC ........ H01S 5/34333; H01S 5/183; H01S 5/22; H01S 5/3407; H01S 5/3416; H01S 5/343;
(Continued)

(56) References Cited

U.S. PATENT DOCUMENTS

2008/0217632 A1  9/2008  Tomiya et al.
2010/0009484 A1  1/2010  Akita et al.
(Continued)

FOREIGN PATENT DOCUMENTS

CN   101626059 A   1/2010
CN   102169931 A   8/2011
(Continued)

OTHER PUBLICATIONS

Office Action for CN Patent Application No. 201580068863.5, dated Jan. 16, 2019, 10 pages of Office Action and 08 pages of English Translation.
(Continued)

*Primary Examiner* — Matthew C Landau
*Assistant Examiner* — Dmitriy Yemelyanov
(74) *Attorney, Agent, or Firm* — Chip Law Group

(57) ABSTRACT

Provided is an optical semiconductor device including a laminate structural body 20 in which an n-type compound semiconductor layer 21, an active layer 23, and a p-type compound semiconductor layer 22 are laminated in this order. The active layer 23 includes a multiquantum well structure including a tunnel barrier layer 33, and a compositional variation of a well layer $31_2$ adjacent to the p-type compound semiconductor layer 22 is greater than a compositional variation of another well layer $31_1$. Band gap energy of the well layer $31_2$ adjacent to the p-type compound semiconductor layer 22 is smaller than band gap energy of the other well layer $31_1$. A thickness of the well layer $31_2$ adjacent to the p-type compound semiconductor layer 22 is greater than a thickness of the other well layer $31_1$.

4 Claims, 12 Drawing Sheets

(51) Int. Cl.
- *H01L 33/32* (2010.01)
- *H01S 5/183* (2006.01)
- *H01S 5/22* (2006.01)
- *H01L 21/02* (2006.01)
- *H01S 5/34* (2006.01)
- *H01S 5/30* (2006.01)
- *H01S 5/028* (2006.01)
- *H01S 5/042* (2006.01)

(52) U.S. Cl.
CPC .. *H01L 21/02389* (2013.01); *H01L 21/02433* (2013.01); *H01L 21/02576* (2013.01); *H01L 21/02579* (2013.01); *H01L 33/06* (2013.01); *H01L 33/32* (2013.01); *H01S 5/183* (2013.01); *H01S 5/22* (2013.01); *H01S 5/343* (2013.01); *H01S 5/3407* (2013.01); *H01S 5/3416* (2013.01); *H01S 5/0287* (2013.01); *H01S 5/0425* (2013.01); *H01S 5/305* (2013.01); *H01S 5/3063* (2013.01); *H01S 2304/04* (2013.01)

(58) Field of Classification Search
CPC ...... H01S 5/0287; H01S 5/0425; H01S 5/305; H01S 5/3063; H01S 2304/04; H01L 21/02389; H01L 21/02433; H01L 21/0254; H01L 21/02576; H01L 21/02579; H01L 21/0262; H01L 33/06; H01L 33/32
See application file for complete search history.

(56) References Cited

U.S. PATENT DOCUMENTS

| | | | |
|---|---|---|---|
| 2011/0204394 | A1 | 8/2011 | Hikosaka et al. |
| 2013/0320299 | A1 | 12/2013 | Li |
| 2014/0346441 | A1* | 11/2014 | Shur ........................ H01L 33/18 257/15 |
| 2014/0353581 | A1* | 12/2014 | Strassburg ............. H01L 33/08 257/13 |

FOREIGN PATENT DOCUMENTS

| | | | |
|---|---|---|---|
| EP | 1667292 | A1 | 6/2006 |
| EP | 2144278 | A2 | 1/2010 |
| JP | 2000-174328 | A | 6/2000 |
| JP | 2010-021290 | A | 1/2010 |
| JP | 2011-54982 | A | 3/2011 |
| JP | 2011-176240 | A | 9/2011 |
| KR | 10-2006-0114683 | A | 11/2006 |
| KR | 10-2010-0006547 | A | 1/2010 |
| KR | 10-2011-0097590 | A | 8/2011 |
| WO | 2005/020396 | A1 | 3/2005 |
| WO | 2009/139239 | A1 | 11/2009 |
| WO | WO-2009139239 | A1 * | 11/2009 ............ B82Y 20/00 |

OTHER PUBLICATIONS

Sizov, et al., "Carrier Transport in InGaN MQWs of Aquamarine- and Green-Laser Diodes", IEEE Journal of Selected Topics in Quantum Electronics, vol. 17, No. 5, Sep./Oct. 2011, pp. 1390-1401.

International Search Report and Written Opinion of PCT Application No. PCT/JP2015/078087, dated Dec. 15, 2015, 10 pages of English Translation and 09 pages of ISRWO.

International Preliminary Report on Patentability of PCT Application No. PCT/JP2015/078087, dated Jul. 6, 2017, 11 pages of English Translation and 06 pages of IPRP.

Notice of Allowance and Fees Due for U.S. Appl. No. 15/535,142, dated Jun. 20, 2018, 09 pages.

Non-Final Rejection for U.S. Appl. No. 15/535,142, dated Jan. 25, 2018, 13 pages.

Office Action for JP Patent Application No. 2016565973, dated Aug. 6, 2019, 08 pages of Office Action and 06 pages of English Translation.

* cited by examiner

OPTICAL SEMICONDUCTOR DEVICE

CROSS-REFERENCE TO RELATED APPLICATIONS

The present application is a continuation application of U.S. patent application Ser. No. 15/535,142, filed Jun. 12, 2017, which is a National Stage Entry of PCT/JP2015/078087, filed Oct. 2, 2015, and claims the benefit of priority from prior Japanese Patent Application JP 2014-264732, filed Dec. 26, 2014, the entire content of which is hereby incorporated by reference.

TECHNICAL FIELD

The present disclosure relates to an optical semiconductor device.

BACKGROUND ART

Increase of the emission efficiency and reduction of the threshold current in various light emitting diodes or semiconductor laser devices are essential for high output and improvement of power consumption or the like and are currently being intensively investigated. However, in a nitride compound semiconductor light emitting device which emits blue or green light, the amount of current injected increases as the emission wavelength increases, which causes problems such as a reduction in the emission efficiency and an increase in the threshold current. One cause of these problems is non-uniformity of carriers in an active layer (i.e., a light emitting layer). That is, the energy gap difference between barrier and well layers which constitute a multiquantum well structure increases as the emission wavelength increases. In addition, when an active layer is formed on a c-surface of a GaN substrate, piezoelectric field effects occur in well or barrier layers such that it is difficult for carriers (electrons or holes) to exit a well layer once they have entered the well layer, thus causing non-uniformity of carriers in the active layer (light emitting layer).

An example in which such a phenomenon is represented by numerical calculation is described in Non-Patent Literature 1, IEEE, Journal of Selected Topics in Quantum Electronics Vol. 15 No. 5 (2011) p. 1390. According to this Non-Patent Literature 1, the difficulty for carriers in a well layer to exit the well layer when the emission wavelength is equal to or greater than 400 nm in the case where an active layer is formed on a c-surface of a GaN substrate, and when the emission wavelength is equal to or greater than 450 nm in the case where an active layer is formed on a non-polar surface of a GaN substrate, is illustrated by a relationship between an emission recombination time and the time required for a carrier to escape from a well layer (see FIG. 12). In FIG. 12, "A" represents the behavior of a hole in the case where an active layer is formed on a c-surface of a GaN substrate, "B" represents the behavior of an electron in the case where an active layer is formed on a c-surface of a GaN substrate, "a" represents the behavior of a hole in the case where an active layer is formed on a non-polar surface of a GaN substrate, and "b" represents the behavior of an electron in the case where an active layer is formed on a non-polar surface of a GaN substrate. Typically, carriers move between well layers in a multiquantum well structure having two or more well layers in a very short time of about 100 femtoseconds or less. However, for the above reasons, the time required for a carrier to escape from a well layer is increased and electrons or holes cannot freely move between well layers. As a result, the electron and hole concentrations in each well layer differ from each other and remaining carriers do not contribute to emission, reducing the emission efficiency. In addition, significant differences in the carrier concentration between well layers lead to variations in the emission wavelength and variations in the gain peak (wavelength), which also causes a reduction in the emission efficiency and an increase in the threshold current.

CITATION LIST

Patent Literature

Patent Literature 1: JP 2000-174328A

Non-Patent Literature

Non-Patent Literature 1: IEEE, Journal of Selected Topics in Quantum Electronics Vol. 15 No. 5 (2011) p. 1390

DISCLOSURE OF INVENTION

Technical Problem

A technology in which a tunnel barrier layer is formed to reduce the difference between the electron and hole concentrations of well layers is disclosed, for example, in JP 2000-174328A. Specifically, in the technology disclosed in this patent application publication, the thickness of the tunnel barrier layer is controlled to change the tunneling probability in the tunnel barrier layer. However, when the effective mass difference between electrons and holes is great, non-uniformity of carriers is not fully avoided even though such a tunnel barrier layer is provided. Reducing the thickness of only the barrier layer without forming a tunnel barrier layer can also be considered. However, reducing the thickness of the barrier layer causes the problem of a reduction in the emission efficiency of an adjacent well layer. For example, in a light emitting device (optical semiconductor device) having an emission wavelength of 520 nm, it is known that the emission efficiency when the thickness of the barrier layer is 2.5 nm is about ¼ of the emission efficiency when the thickness of the barrier layer is 10 nm.

Therefore, an object of the present disclosure is to provide an optical semiconductor device having a configuration and a structure which make it possible to suppress a reduction in the emission efficiency and an increase in the threshold current.

Solution to Problem

According to a first aspect, a second aspect, or a third aspect of the present disclosure to achieve the above object, there is provided an optical semiconductor device including a laminate structural body in which an n-type compound semiconductor layer, an active layer, and a p-type compound semiconductor layer are laminated in this order. The active layer includes a multiquantum well structure including a tunnel barrier layer.

In the optical semiconductor device according to the first aspect of the present disclosure, a compositional variation of a well layer adjacent to the p-type compound semiconductor layer is greater than a compositional variation of another well layer.

Further, in the optical semiconductor device according to the second aspect of the present disclosure, band gap energy of the well layer adjacent to the p-type compound semiconductor layer may be smaller than band gap energy of the other well layer.

In addition, in the optical semiconductor device according to the third aspect of the present disclosure, a thickness of the well layer adjacent to the p-type compound semiconductor layer may be greater than a thickness of the other well layer.

Advantageous Effects of Invention

In the optical semiconductor device according to the first to third aspects of the present disclosure, as tunnel barrier layers are provided, electrons are distributed unevenly such that many electrons are present at the side of the p-type compound semiconductor layer. As a result, the emission peak wavelength or the optical gain peak wavelength of a well layer adjacent to the p-type compound semiconductor layer differs from that of another well layer. Specifically, these wavelengths of the well layer adjacent to the p-type compound semiconductor layer are shortened. The compositional variation of a well layer adjacent to the p-type compound semiconductor layer is greater than the compositional variation of another well layer in the optical semiconductor device according to the first aspect of the present disclosure, the band gap energy of a well layer adjacent to the p-type compound semiconductor layer is smaller than the band gap energy of another well layer in the optical semiconductor device according to the second aspect of the present disclosure, and the thickness of a well layer adjacent to the p-type compound semiconductor layer is greater than the thickness of another well layer in the optical semiconductor device according to the third aspect of the present disclosure. Therefore, it is possible to uniformize the emission peak wavelengths or the optical gain peak wavelengths of well layers or to reduce the difference therebetween. As a result, it is possible to increase the emission efficiency and to reduce the threshold current. The advantageous effects described in this specification are only exemplary and are not intended to be limitative and additional advantageous effects may also be achieved.

MODE(S) FOR CARRYING OUT THE INVENTION

Figure 1A:
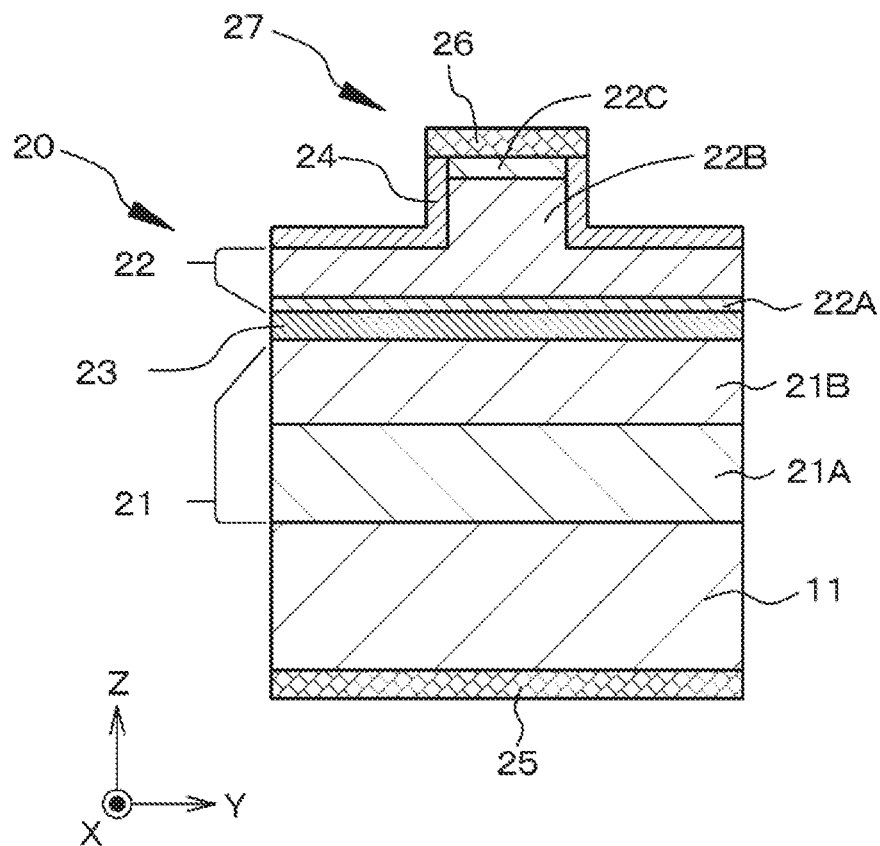
FIGS. 1A and 1B are a schematic partial sectional view of an optical semiconductor device of embodiment 1 and a schematic structural view of a multiquantum well structure in an active layer.

Although the present disclosure will hereinafter be described on the basis of embodiments with reference to the drawings, the present disclosure is not limited to the embodiments and the various values or materials in the embodiments are exemplary. The description will be given in the following order.
1. Optical semiconductor device according to first to third aspects of the present disclosure, general description
2. Embodiment 1 (optical semiconductor device according to first aspect of the present disclosure, semiconductor laser device)
3. Embodiment 2 (optical semiconductor device according to second aspect of the present disclosure, semiconductor laser device)
4. Embodiment 3 (optical semiconductor device according to third aspect of the present disclosure, semiconductor laser device)
5. Embodiment 4 (modification of embodiments 1 to 3, light emitting diode)
6. Embodiment 5 (modification of embodiments 1 to 3, surface-emitting laser device)
7. Embodiment 6 (modification of embodiment 5)
8. Embodiment 7 (another modification of embodiments 5 and 6)
9. Embodiment 8 (modification of embodiment 6)
10. Embodiment 9 (another modification of embodiment 8)
11. Embodiment 10 (modification of embodiments 8 and 9)
12. Others
<Optical Semiconductor Device According to First to Third Aspects of the Present Disclosure, General Description>

In an optical semiconductor device according to the first to third aspects of the present disclosure, a surface of an n-type compound semiconductor layer that is in contact with an active layer is referred to as a second surface of the n-type compound semiconductor layer and a surface thereof that is opposite to the second surface is referred to as a first surface of the n-type compound semiconductor layer. A surface of a p-type compound semiconductor layer that is in contact with the active layer is referred to as a first surface of the p-type compound semiconductor layer and a surface thereof that is opposite to the first surface is referred to as a second surface of the p-type compound semiconductor layer.

The optical semiconductor device according to the first aspect of the present disclosure may be provided in a form such that a band gap energy of a well layer adjacent to the p-type compound semiconductor layer is smaller than a band gap energy of another well layer. As an alternative, the optical semiconductor device may be provided in a form such that the thickness of a well layer adjacent to the p-type compound semiconductor layer is greater than the thickness of another well layer and, in this case, band gap energy of the well layer adjacent to the p-type compound semiconductor layer may be smaller than band gap energy of the other well layer.

The optical semiconductor device according to the second aspect of the present disclosure may be provided in a form such that the thickness of a well layer adjacent to the p-type compound semiconductor layer is greater than the thickness of another well layer.

The optical semiconductor device according to the first to third aspects of the present disclosure including the various preferable forms described above may be provided in a form such that a tunnel barrier layer is formed between a well layer and a barrier layer. As an example, when an active layer includes two well layers and one barrier layer, the active layer has a structure which includes, sequentially from the side of the n-type compound semiconductor layer, a first well layer, a first tunnel barrier layer, the barrier layer, a second tunnel barrier layer, and a second well layer. However, the number of well layers included in the active layer is not limited to 2 and may be equal to or greater than 3.

In the optical semiconductor device according to the first to third aspects of the present disclosure including the various preferable forms described above, it is preferable that the thickness of each of the tunnel barrier layers is equal to or less than 4 nm. The lower limit of the thickness of each tunnel barrier layer is not especially limited as long as the tunnel barrier layer is formed. The thickness of each tunnel barrier layer may be constant and may also vary.

In addition, the optical semiconductor device according to the first to third aspects of the present disclosure including the various preferable forms described above may be configured such that the active layer is made of an AlInGaN-based compound semiconductor. In this case, the tunnel barrier layers may be made of GaN. In these cases, the n-type compound semiconductor layer may be formed on a c-surface of a GaN substrate. In addition, in these cases, the emission wavelength may be equal to or greater than 440 nm.

The compositional variation or the composition of the well layer in the optical semiconductor device according to the first aspect of the present disclosure may be measured, for example, on the basis of a 3 dimensional atom probe (3DAP). When the active layer is made of an AlInGaN-based compound semiconductor, the compositional variation or the composition of indium the may be measured on the basis of a 3 dimensional atom probe. With respect to the 3 dimensional atom probe, for example, see http://www.nanoanalysis.co.jp/business/case_example_49.html. The indium composition can be measured and indium atoms in the composition can be counted using the 3 dimensional atom probe. In the case where the indium composition and the number of indium atoms in the composition are represented by a histogram or the like with the horizontal axis indicating the composition of indium and the vertical axis indicating the number of indium atoms in the composition, it is known that the compositional variation of a well layer adjacent to the p-type compound semiconductor layer is greater than the compositional variation of another well layer when values such as a half-value width, a variance, or a standard deviation of the histogram of the well layer adjacent to the p-type compound semiconductor layer are greater than those values for the other well layer.

The band gap energy of the optical semiconductor device according to the second aspect of the present disclosure can be determined, for example, on the basis of an average value of the composition of indium measured by the 3 dimensional atom probe and the thickness of a well layer of the optical semiconductor device according to the third aspect of the present disclosure can be obtained, for example, using a high-resolution electron microscope or the like.

In the optical semiconductor device according to the second aspect of the present disclosure or in the preferable forms of the optical semiconductor device according to the first and third aspects of the present disclosure, the band gap energy of the well layer adjacent to the p-type compound semiconductor layer may be smaller than the band gap energy of the other well layer and a value obtained by subtracting the maximum value of the band gap energy of the other well layer from the band gap energy of the well layer adjacent to the p-type compound semiconductor layer may be exemplified as, but is not limited to, $1 \times 10^{-4}$ eV to $2 \times 10^{-1}$ eV.

In the optical semiconductor device according to the third aspect of the present disclosure or in the preferable forms of the optical semiconductor device according to the first and second aspects of the present disclosure, the thickness of the well layer adjacent to the p-type compound semiconductor layer may be greater than the thickness of the other well layer and a value obtained by subtracting the maximum value of the thickness of the other well layer from the thickness of the well layer adjacent to the p-type compound semiconductor layer may be exemplified as, but is not limited to, 0.05 nm to 2 nm.

As a material which constitutes the active layer and as a material which constitutes a laminate structural body in the optical semiconductor device according to the first to third aspects of the present disclosure, it is possible to employ a GaN-based compound semiconductor, specifically an AlInGaN-based compound semiconductor as described above, and more specifically, GaN, AlGaN, InGaN, and AlInGaN. In addition, a boron (B) atom(s), a thallium (Tl) atom(s), an arsenic (As) atom(s), a phosphorus (P) atom(s), or an antimony (Sb) atom(s) may be included as desired in such compound semiconductors. A combination (a compound semiconductor that constitutes a well layer, a compound semiconductor that constitutes a barrier layer) may be exemplified by $(In_yGa_{(1-y)}N, In_zGa_{(1-z)}N)$ (where y>z) and $(In_yGa_{(1-y)}N, AlGaN)$. The thickness of a well layer may be, but is not limited to, equal to or greater than 1 nm and equal to or less than 10 nm, preferably equal to or greater than 1 nm and equal to or less than 8 nm, and the impurity doping concentration of a barrier layer may be, but is not limited to, equal to or greater than $1 \times 10^{18}$ cm$^{-3}$ and equal to or less than $1 \times 10^{20}$ cm$^{-3}$, preferably equal to or greater than $1 \times 10^{18}$ cm$^{-3}$ and equal to or less than $1 \times 10^{19}$ cm$^{-3}$.

In the p-type compound semiconductor layer, an electron barrier layer may be formed near or adjacent to the active layer and a non-doped compound semiconductor layer (for example, a non-doped InGaN layer or a non-doped AlGaN layer) may be formed between the active layer and the electron barrier layer. In addition, a non-doped InGaN layer may be formed as a light guide layer between the active layer and the non-doped compound semiconductor layer. The p-type compound semiconductor layer may also has a structure such that the top layer of the p-type compound semiconductor layer is occupied by a Mg doped GaN layer (a p-side contact layer or a p-contact layer). The electron barrier layer, the non-doped compound semiconductor layer, the light guide layer, and the p-side contact layer (p-contact layer) constitute the p-type compound semiconductor layer.

The n-type compound semiconductor layer is formed preferably, but not limited to being formed, on a c-surface of a GaN substrate, i.e., on a {0001} surface thereof and may also be formed on a non-polar surface such as an a-surface which is an {11-20} surface, an m-surface which is a {1-100} surface, or a {1-102} surface or alternatively on a half-polar surface such as {11-2n} surfaces including an {11-24} surface and an {11-22} surface, a {10-11} surface, a {10-12} surface, or a {20-21} surface. A foundation layer or a buffer layer may also be formed on a surface (primary surface) of a substrate other than the GaN substrate, such as a sapphire substrate, a GaAs substrate, a GaN substrate, a SiC substrate, an alumina substrate, a ZnS substrate, a ZnO substrate, an AlN substrate, a LiMgO substrate, a $LiGaO_2$ substrate, a $MgAl_2O_4$ substrate, an InP substrate, or a Si substrate.

As a method of forming various compound semiconductor layers (for example, GaN-based compound semiconductor layers) that constitute the optical semiconductor device of the present disclosure, it is possible to employ a metalorganic vapor phase growth method (such as an MOCVD method or an MOVPE method), a molecular beam epitaxy method (i.e., an MBE method), a hydride vapor phase growth method in which halogen contributes to transportation or reaction, or the like.

Here, in the MOCVD method, it is possible to employ trimethylgallium (TMG) gas or triethylgallium (TEG) gas as an organic gallium source gas and it is possible to employ ammonia gas or hydrazine gas as a nitrogen source gas. For example, silicon (Si) may be added as an n-type impurity (n-type dopant) to form a GaN-based compound semiconductor layer having n-type conductivity and, for example, magnesium (Mg) may be added as a p-type impurity (p-type dopant) to form a GaN-based compound semiconductor layer having p-type conductivity. In the case where aluminum (Al) or indium (In) is included as constituent atoms in the GaN-based compound semiconductor layer, trimethylaluminum (TMA) gas may be used as an Al source and trimethylindium (TMI) gas may be used as an In source. In addition, monosilane gas ($SiH_4$ gas) may be used as a Si source, and cyclopentadienyl magnesium gas, methyl cyclopentadienyl magnesium gas, or bis(cyclopentadienyl)magnesium ($Cp_2Mg$) gas may be used as a Mg source. As an n-type impurity (n-type dopant) other than Si, it is possible to employ Ge, Se, Sn, C, Te, S, O, Pd, or Po and, as a p-type impurity (p-type dopant) other than Mg, it is possible to employ Zn, Cd, Be, Ca, Ba, C, Hg, or Sr.

In the optical semiconductor device, a p-side electrode is formed on the p-type compound semiconductor layer (which is a compound semiconductor layer having p-type conductivity). Here, the p-side electrode may be made, for example, of a single palladium (Pd) layer, a single nickel (Ni) layer, a single platinum (Pt) layer, a transparent conductive material layer such as an ITO layer, a laminate structure of palladium layer/platinum layer where the palladium layer is in contact with the p-type compound semiconductor layer, or a laminate structure of palladium layer/nickel layer where the palladium layer is in contact with the p-type compound semiconductor layer. In the case where a lower metal layer is made of palladium and an upper metal layer is made of nickel, it is desirable that the thickness of the upper metal layer be equal to or greater than 0.1 µm, preferably equal to or greater than 0.2 µm. As an alternative, the p-side electrode is preferably made of a single palladium (Pd) layer. In this case, it is desirable that the thickness be equal to or greater than 20 nm, preferably equal to or greater than 50 nm. As another alternative, the p-side electrode is preferably made of a single palladium (Pd) layer, a single nickel (Ni) layer, a single platinum (Pt) layer, or a laminate structure including a lower metal layer and an upper metal layer where the lower metal layer is in contact with the p-type compound semiconductor layer.

It is desirable that the n-side electrode that is electrically connected to the n-type compound semiconductor layer (which is a compound semiconductor layer having n-type conductivity) have a single layer configuration or a multilayer configuration including at least one type of metal selected from the group consisting of gold (Au), silver (Ag), palladium (Pd), aluminum (Al), titanium (Ti), tungsten (W), copper (Cu), zinc (Zn), tin (Sn), and indium (In), which may be exemplified, for example, by Ti/Au, Ti/Al, or Ti/Pt/Au. The form in which the n-side electrode is electrically connected to the n-type compound semiconductor layer includes a form in which the n-side electrode is formed on the n-type compound semiconductor layer and a form in which the n-side electrode is connected to the n-type compound semiconductor layer via a conductive substrate or base or a conductive material layer. The n-side electrode or the p-side electrode may be deposited, for example, using various PVD methods such as a vacuum evaporation method or a sputtering method.

A pad electrode may be provided on the n-side electrode or the p-side electrode to electrically connect the n-side electrode or the p-side electrode to an external electrode or circuit. It is desirable that the pad electrode have a single layer configuration or a multilayer configuration including at least one type of metal selected from the group consisting of titanium (Ti), aluminum (Al), platinum (Pt), gold (Au), and nickel (Ni). As an alternative, the pad electrode may have a multilayer configuration which is exemplified by a Ti/Pt/Au multilayer configuration and a Ti/Au multilayer configuration.

As the optical semiconductor device, it is possible to employ a light emitting diode (LED), a semiconductor laser device (LD), a super luminescent diode (SLD), a surface-emitting laser device which is called a vertical resonator laser or a VCSEL, or a semiconductor optical amplifier (SOA). These optical semiconductor devices or the basic configurations and structures thereof may have well-known configurations and structures, except for the configuration and structure of the active layer. When a light emitting diode (LED) is employed, light generated from the active layer may be emitted outside via the n-type compound semiconductor layer and may be emitted outside via the p-type compound semiconductor layer. When a semiconductor laser device (LD) is employed, light generated from the active layer is emitted outside from an end surface of the laminate structural body. That is, a resonator is configured by optimizing the optical reflectance of a first end surface of the laminate structural body and the optical reflectance of a second end surface that is opposite to the first end surface, and light is emitted from the first end surface. As an alternative, an external resonator may be provided and a monolithic type semiconductor laser device may be employed. The external resonator type semiconductor laser device may be a light collecting type and may be a collimation type. When a super luminescent diode (SLD) is employed, the optical reflectance of the first end surface of the laminate structural body is made very low and the optical reflectance of the second end surface is made very high and no resonator is constructed, and light generated from the active layer is emitted from the first end surface. An antireflective coating layer (AR) or a low-reflective coating layer is formed on the first end surface and a high-reflective coating layer (HR) is formed on the second end surface. A semiconductor optical amplifier (SOA) is configured to amplify an optical signal in a state of direct light without conversion into an electrical signal and has a laser structure that fully excludes resonator effects and amplifies incident light with an optical gain of the semiconductor optical amplifier. When a semiconductor optical amplifier is employed, the optical reflectance of the first end surface of the laminate structural body and the optical reflectance of the second end surface thereof are made very low and no resonator is constructed, and light incident on the second end surface is amplified and emitted from the first end surface. When a surface-emitting laser device (VCSEL) is employed, a first optical reflective layer is formed on a first surface of the n-type compound semiconductor layer and a second optical reflective layer is formed on or over a second surface of the p-type compound semiconductor layer. An antireflective coating layer (AR) or a low-reflective coating layer is formed on the first end surface and the second end surface. As the anti-reflective coating layer (low-reflective coating layer) or the high-reflective coating layer, it is possible to employ a laminate structure of at least two layers selected from the group consisting of a titanium oxide layer, a tantalum oxide layer, a zirconium oxide layer, a silicon oxide layer, an aluminum oxide layer, an aluminum nitride layer, and a silicon nitride layer and they may be formed on the basis of a PVD method such as a sputtering method or a vacuum evaporation method.

In the case where the laminate structural body of the optical semiconductor device of the present disclosure has a ridge stripe structure, the ridge stripe structure may be constructed of a part of the p-type compound semiconductor layer in the thickness direction thereof and may be constructed of the p-type compound semiconductor layer alone, may be constructed of both the p-type compound semiconductor layer and the active layer and may also be constructed of a part of the p-type compound semiconductor layer, the active layer, and the n-type compound semiconductor layer in the thickness direction thereof. To form the ridge stripe structure, a compound semiconductor layer may be patterned, for example, using a dry etching method.

Embodiment 1

Figure 1B:
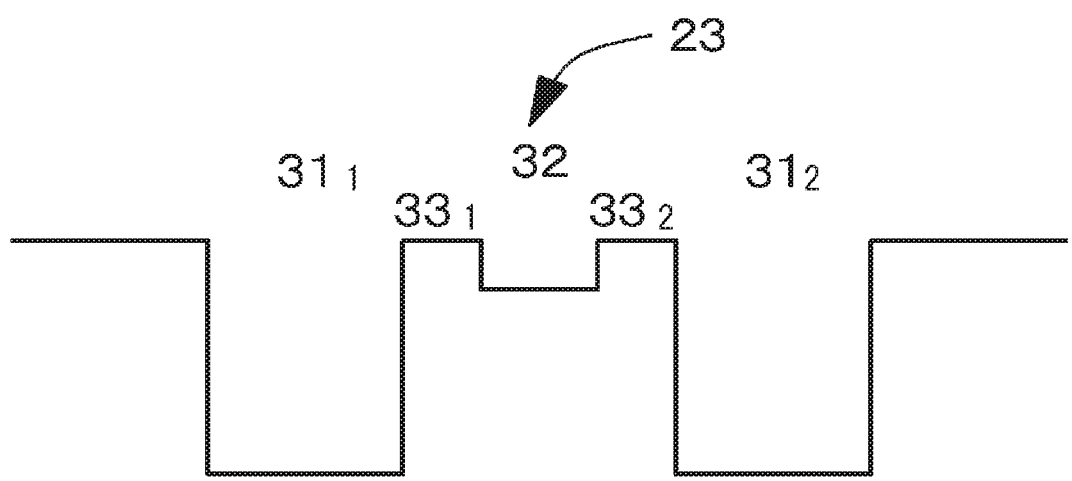

Embodiment 1 relates to an optical semiconductor device, specifically to a semiconductor laser device (LD), according to the first aspect of the present disclosure. FIG. 1A is a schematic partial sectional view of an optical semiconductor device of embodiment 1, specifically a schematic partial sectional view of an optical semiconductor device taken along a virtual plane (YZ plane) perpendicular to the extending direction of a resonator and FIG. 1B is a schematic structural view of a multiquantum well structure in an active layer. FIG. 1B shows a band structure without considering the influence of piezoelectric fields for the sake of convenience.

The semiconductor optical device of embodiment 1 or embodiments 1 to 10 described later has a laminate structural body 20 in which an n-type compound semiconductor layer 21, an active layer 23, and a p-type compound semiconductor layer 22 are laminated in this order. The active layer 23 includes a multiquantum well structure having a tunnel barrier layer 33. Specifically, the tunnel barrier layer 33 is formed between a well layer 31 and a barrier layer 32. In embodiment 1 or embodiments 2 to 10 described later, the active layer 23 includes two well layers $31_1$ and $31_2$ and one barrier layer 32. More specifically, the active layer 23 has a multiquantum well structure which includes, sequentially from the side of the n-type compound semiconductor layer 21, a first well layer $31_1$, a first tunnel barrier layer 331, a barrier layer 32, a second tunnel barrier layer 332, and a second well layer $31_2$. The thickness of each of the tunnel barrier layers 331 and 332 is equal to or less than 4 nm.

The laminate structural body 20 is formed on a substrate 11. The substrate 11 is specifically constructed of a GaN substrate and the laminate structural body 20, specifically the n-type compound semiconductor layer 21, is formed on a c-surface of the GaN substrate, i.e., on a (0001) surface thereof. An n-side electrode 25 is formed on a rear surface of the substrate 11 and a p-side electrode 26 is formed on the p-type compound semiconductor layer 22. The laminate structural body 20 is covered with an insulating layer 24. The refractive index of a material that constitutes the insulating layer 24 is preferably less than the refractive index of a material that constitutes the laminate structural body 20. The material that constitutes the insulating layer 24 may be exemplified by SiOx-based material including $SiO_2$, a $SiN_X$-based material, a $SiO_XN_Z$-based material, $TaO_X$, $ZrO_X$, $AlN_X$, $AlO_X$, and $GaO_X$ or may include an organic material such as a polyimide resin. Examples of the method of forming the insulating layer 24 include a PVD method such as a vacuum evaporation method or a sputtering method or a CVD method, and the insulating layer 24 may also be formed on the basis of a coating method.

Here, in the optical semiconductor device of embodiment 1 or embodiments 2 to 4 described later which is made of a semiconductor laser device, it is assumed that the configuration of the laminate structural body 20 or the like is as in Table 1 below. It is also assumed that the configuration of the active layer 23 of the optical semiconductor device of embodiment 1 is as in Table 2. In addition, the value of the composition of indium in the two tunnel barrier layers 331 and 332 may be made less than the value of the composition of indium in the barrier layer 32. The active layer 23 is made of an AlInGaN-based compound semiconductor and the tunnel barrier layers 331 and 332 are made of GaN. The emission wavelength of the semiconductor laser device of embodiment 1 is equal to or greater than 440 nm and is specifically 460 nm.

TABLE 1

| | |
|---|---|
| p-side electrode 26 | Pd/Au |
| p-type compound semiconductor layer 22 | |
| | |
| p-contact layer 22C | GaN (thickness: 0.1 µm) |
| p-clad layer 22B | AlGaN (thickness: 0.3 µm) |
| Electron barrier layer 22A | AlGaN |
| Active layer 23 | See Table 2 |
| n-type compound semiconductor layer 21 | |
| | |
| n-guide layer 21B | InGaN (thickness: 0.1 µm) |
| n-clad layer 21A | AlGaN (thickness: 0.4 µm) |
| Substrate 11 | GaN substrate, c-surface |
| n-side electrode 25 | Ti/Pt/Au |

TABLE 2

| Active layer | |
| --- | --- |
| Second well layer | $In_{0.30}Ga_{0.70}N$ (thickness: 2.5 nm) |
| Second tunnel barrier layer | GaN (thickness: 2.0 nm) |
| Barrier layer | $In_{0.05}Ga_{0.95}N$ (thickness: 4.0 nm) |
| First tunnel barrier layer | GaN (thickness: 2.0 nm) |
| First well layer | $In_{0.30}Ga_{0.70}N$ (thickness: 2.5 nm) |

Here, in the optical semiconductor device of embodiment 1, the compositional variation of a well layer adjacent to the p-type compound semiconductor layer is greater than the compositional variation of another well layer. Specifically, the variation of the composition of indium in the well layers $31_1$ and $31_2$ is increased by allowing the deposition speed or temperature and/or the deposition pressure of the first well layer $31_1$ to be different from the deposition speed or temperature and/or the deposition pressure of the second well layer $31_2$ when the laminate structural body 20 is deposited on the basis of an MOCVD method. The compositional variation or the composition of indium can be measured on the basis of a 3 dimensional atom probe (3DAP) as described above. Specifically, in the case where the indium composition and the number of indium atoms in the composition measured by the 3 dimensional atom probe are represented by a histogram or the like with the horizontal axis indicating the indium composition and the vertical axis indicating the number of indium atoms in the composition, it is found that the compositional variation of a well layer adjacent to the p-type compound semiconductor layer is greater than the compositional variation of another well layer when a half-value width of the histogram of the well layer adjacent to the p-type compound semiconductor layer is greater than a half-value width of the other well layer.

The optical semiconductor device of embodiment 1 or embodiments 2 and 3 described later can be manufactured using the following method.

[Process 100]

First, a laminate structural body 20 including an n-type compound semiconductor layer 21, an active layer 23, and a p-type compound semiconductor layer 22 which are sequentially laminated is formed on a substrate 11, specifically on a (0001) surface of an n-type GaN substrate, on the basis of a well-known MOCVD method. Then, the p-type compound semiconductor layer 22 is partially etched in the thickness direction to form a ridge stripe structure 27. The thickness of a part of the p-type compound semiconductor layer 22 which constitutes the ridge stripe structure 27 is 0.12 μm.

[Process 110]

Then, an insulating layer 24 including $SiO_2$ is formed to cover the p-type compound semiconductor layer 22 and thereafter a Si layer (not shown) is formed on the insulating layer 24. Then, a p-side electrode 26 is formed on the p-type compound semiconductor layer 22 after portions of the insulating layer 24 and the Si layer where the p-side electrode 26 is to be formed are removed. Specifically, after a p-side electrode layer is deposited over the entire surface on the basis of a vacuum evaporation method, an etching resist layer is formed on the p-side electrode layer on the basis of a photolithography technology. Then, the etching resist layer is removed after a portion of the p-side electrode layer which is not covered with the etching resist layer is removed on the basis of an etching method. The p-side electrode 26 may also be formed on the p-type compound semiconductor layer 22 on the basis of a liftoff method.

[Process 120]

Then, the substrate 11 is polished from the rear surface to decrease the thickness of the substrate 11. Thereafter, an n-side electrode 25 is formed on the rear surface of the substrate 11 and a pad electrode is formed on the p-side electrode 26. Then, cleavage or the like of the substrate 11 is performed, and an anti-reflective coating layer (AR) or a low-reflective coating layer is formed on a first end surface of the laminate structural body 20 and a high-reflective coating layer (HR) is formed on a second end surface thereof to perform optical reflectance control on the first and second end surfaces of the laminate structural body 20. Packaging may then be performed to manufacture an optical semiconductor device.

In the optical semiconductor device of embodiment 1 or embodiments 2 to 10 described later, as tunnel barrier layers are provided, electrons are distributed unevenly such that many electrons are present at the side of the p-type compound semiconductor layer. As a result, the emission peak wavelength or the optical gain peak wavelength of a well layer adjacent to the p-type compound semiconductor layer differs from that of another well layer. Specifically, these wavelengths of the well layer adjacent to the p-type compound semiconductor layer are shortened. However, in the optical semiconductor device of embodiment 1, the compositional variation of a well layer adjacent to the p-type compound semiconductor layer is greater than the compositional variation of another well layer and therefore the emission peak wavelength or the optical gain peak wavelength of the well layer adjacent to the p-type compound semiconductor layer is lengthened such that it is possible to uniformize the emission peak wavelengths or the optical gain peak wavelengths of well layers or to reduce the difference therebetween. As a result, it is possible to increase the emission efficiency and to reduce the threshold current. It is also possible to suppress non-uniformity of carriers in the active layer since it is possible to exclude the influence of piezoelectric fields on the well layer or barrier layer even though the active layer is formed on the c-surface of the GaN substrate.

Note that, as described above, the configuration and structure of a super luminescent diode (SLD) or a semiconductor optical amplifier (SOA) are substantially the same as those of the semiconductor laser device described above in embodiment 1 or a semiconductor laser device described later in embodiments 2 and 3, except that the optimization of optical reflectance of the first and second end surfaces, the formation of a resonator, or the like thereof differ from that of the semiconductor laser device.

Embodiment 2

Embodiment 2 relates to an optical semiconductor device, specifically to a semiconductor laser device (LD), according to the second aspect of the present disclosure. In the optical semiconductor device of embodiment 2, the band gap energy of a well layer (the second well layer $31_2$) adjacent to the p-type compound semiconductor layer is smaller than the band gap energy of another well layer (specifically, the first well layer $31_1$) (see Table 4). Here, it is assumed that the configuration of an active layer 23 in the optical semiconductor device of embodiment 2 is as in Table 3. The emission wavelength of the semiconductor laser device of embodiment 2 is equal to or greater than 440 nm and is specifically 460 nm. Specifically, the band gap energy of the well layer (the second well layer $31_2$) adjacent to the p-type compound semiconductor layer can be made smaller than the band gap energy of another well layer (specifically, the first well layer $31_1$) by allowing the amount of supply of trimethylindium (TMI) gas as an indium source for depositing the second well layer $31_2$ to be greater than the amount of supply of trimethylindium gas as an indium source for depositing the first well layer $31_1$ or by increasing the deposition speed of the second well layer $31_2$ when the laminate structural body 20 is deposited on the basis of an MOCVD method.

TABLE 3

| Active layer | |
|---|---|
| Second well layer | $In_{0.19}Ga_{0.81}N$ (thickness: 2.5 nm) |
| Second tunnel barrier layer | GaN (thickness: 2.0 nm) |
| Barrier layer | $In_{0.04}Ga_{0.96}N$ (thickness: 4.0 nm) |
| First tunnel barrier layer | GaN (thickness: 2.0 nm) |
| First well layer | $In_{0.18}Ga_{0.82}N$ (thickness: 2.5 nm) |

TABLE 4

| Band gap energy of second well layer $31_2$ | 2.695 eV |
|---|---|
| Band gap energy of first well layer $31_1$ | 2.654 eV |

In the optical semiconductor device of embodiment 2, the band gap energy of a well layer adjacent to the p-type compound semiconductor layer is made smaller than the band gap energy of another well layer and therefore it is possible to uniformize the emission peak wavelengths or the optical gain peak wavelengths of well layers or to reduce the difference therebetween. As a result, it is possible to increase the emission efficiency and to reduce the threshold current.

Embodiment 3

Embodiment 3 relates to an optical semiconductor device, specifically to a semiconductor laser device (LD), according to the third aspect of the present disclosure. In the optical semiconductor device of embodiment 3, the thickness of a well layer (the second well layer $31_2$) adjacent to the p-type compound semiconductor layer is greater than the thickness of another well layer (specifically, the first well layer $31_1$). Here, it is assumed that the configuration of an active layer 23 in the optical semiconductor device of embodiment 3 is as in Table 5. The emission wavelength of the semiconductor laser device of embodiment 3 is equal to or greater than 440 nm and is specifically 460 nm. Specifically, the thickness of the well layer (the second well layer $31_2$) adjacent to the p-type compound semiconductor layer can be made greater than the thickness of another well layer (specifically, the first well layer $31_1$) by allowing the deposition time of the second well layer $31_2$ to be longer than the deposition time of the first well layer $31_1$ or by increasing the deposition speed of the second well layer $31_2$ when the laminate structural body 20 is deposited on the basis of an MOCVD method.

TABLE 5

| Active layer | |
|---|---|
| Second well layer | $In_{0.18}Ga_{0.82}N$ (thickness: 2.8 nm) |
| Second tunnel barrier layer | GaN (thickness: 2.0 nm) |
| Barrier layer | $In_{0.05}Ga_{0.95}N$ (thickness: 4.0 nm) |
| First tunnel barrier layer | GaN (thickness: 2.0 nm) |
| First well layer | $In_{0.18}Ga_{0.82}N$ (thickness: 2.5 nm) |

In the optical semiconductor device of embodiment 3, the thickness of a well layer adjacent to the p-type compound semiconductor layer is made greater than the thickness of another well layer and therefore it is possible to uniformize the emission peak wavelengths or the optical gain peak wavelengths of well layers or to reduce the difference therebetween. As a result, it is possible to increase the emission efficiency and to reduce the threshold current.

Note that it is also possible to combine embodiments 1 and 2, to combine embodiments 1 and 3, to combine embodiments 2 and 3, and to combine embodiments 1, 2, and 3.

Embodiment 4

Embodiment 4 is a modification of embodiments 1 to 3 and specifically relates to a light emitting diode (LED). The configuration (composition) of a laminate structural body in an optical semiconductor device of embodiment 4 may be the same as the configuration (composition) of the laminate structural body in the optical semiconductor device of embodiments 1 to 3 shown in Tables 1 to 5. The structure of the optical semiconductor device of embodiment 4 may be substantially the same as the structure of the optical semiconductor device described in embodiments 1 to 3, except that light generated from an active layer is emitted outside via an n-type compound semiconductor layer 21 or via a p-type compound semiconductor layer 22 and there is no need to form the ridge stripe structures and therefore a detailed description thereof is omitted.

Embodiment 5

Embodiment 5 is also a modification of embodiments 1 to 3 and specifically relates to a surface-emitting laser device (vertical resonator laser or VCSEL). The surface-emitting laser device of embodiment 5 or embodiments 6 and 7 described later is described as a surface-emitting laser device in which an n-type compound semiconductor layer is formed on a substrate including a first optical reflective layer formed thereon on the basis of lateral growth using a method of epitaxial growth in the lateral direction such as an epitaxial lateral overgrowth (ELO) method, but is not limited to this form of surface-emitting laser device. In the following description, an "optical semiconductor device" may sometimes be referred to as a "surface-emitting laser device".

As shown in the schematic partial sectional view of FIG. 2A, the surface-emitting laser device of embodiment 5 or embodiments 6 to 10 described later includes: a first optical reflective layer 51;
   a laminate structural body 20 including an n-type compound semiconductor layer 21, an active layer 23, and a p-type compound semiconductor layer 22 formed on the first optical reflective layer 51; and a p-side electrode 42 and a second optical reflective layer 52 formed on the p-type compound semiconductor layer 22.

The first optical reflective layer 51 is formed on a first surface 21a of the n-type compound semiconductor layer 21 and the second optical reflective layer 52 is formed on a second surface 22b of the p-type compound semiconductor layer 22. The second optical reflective layer 52 is opposite to the first optical reflective layer 51.

Various forms of the surface-emitting laser device of embodiment 5 or embodiments 6 to 10 described later are described below.

The plan shape of the first optical reflective layer may be various polygonal shapes including a regular hexagon, a circle, an ellipse, a grid (rectangular shape), an island, or a stripe. The cross-sectional shape of the first optical reflective layer may be rectangular but is more preferably trapezoidal. That is, it is more preferable that the side surface of the first optical reflective layer have a forward tapered shape.

In the surface-emitting laser device of embodiment 5 or embodiments 6 and 7 described later, the substrate may remain. As an alternative, in the surface-emitting laser device of embodiment 5 or embodiments 6 and 7 described later, the substrate may be removed after an active layer, a p-type compound semiconductor layer, a p-side electrode, and a second optical reflective layer are sequentially formed on an n-type compound semiconductor layer. Specifically, after the active layer, the p-type compound semiconductor layer, the p-side electrode, and the second optical reflective layer are sequentially formed on the n-type compound semiconductor layer and the second optical reflective layer is then fixed to a support substrate, the substrate may be removed (for example, using the first optical reflective layer as a polishing stopper layer in some cases) to expose the n-type compound semiconductor layer (the first surface of the n-type compound semiconductor layer) and also to expose the first optical reflective layer in the case where the first optical reflective layer has been previously formed. The n-side electrode may then be formed on the n-type compound semiconductor layer (on the first surface of the n-type compound semiconductor layer). In the case where the substrate remains, the n-side electrode may be formed on a rear surface of the substrate.

In the case where the substrate is constructed of a GaN substrate, removal of the GaN substrate may be performed in a manner based on a chemical/mechanical polishing method (CMP method). First, a part of the GaN substrate may be removed or the thickness of the GaN substrate may be reduced using a wet etching method, which uses an alkaline aqueous solution such as an aqueous solution of sodium hydroxide or an aqueous solution of potassium hydroxide, an ammonia solution+hydrogen peroxide water, a sulfuric acid solution+hydrogen peroxide water, a hydrochloric acid solution+hydrogen peroxide water, or a phosphoric acid solution+hydrogen peroxide water, a dry etching method, a liftoff method using a laser, a mechanical polishing method, or the like, or a combination thereof and a chemical/mechanical polishing method may then be performed to expose the n-type compound semiconductor layer (the first surface of the n-type compound semiconductor layer) and also to expose the first optical reflective layer in the case where the first optical reflective layer has been previously formed.

In the surface-emitting laser device of embodiment 5 or embodiments 6 to 10 described later, the surface roughness Ra of the p-type compound semiconductor layer (the second surface of the p-type compound semiconductor layer) is preferably equal to or less than 1.0 nm. The surface roughness Ra is predefined in JIS B-610: 2001 and may be specifically measured on the basis of an observation based on an AFM or a cross-sectional TEM. The distance between the first optical reflective layer and the second optical reflective layer is preferably equal to or greater than 0.15 µm and equal to or less than 50 µm.

In addition, the surface-emitting laser device of embodiment 5 or embodiments 6 to 10 described later is preferably provided in a form such that the center of gravity of the area of the second optical reflective layer is not on a line normal to the first optical reflective layer which passes through the center of gravity of the area of the first optical reflective layer. As an alternative, the surface-emitting laser device is preferably provided in a form such that the center of gravity of the area of the active layer (specifically, the center of gravity of an area of the active layer which constitutes a device region, which refers to the same in the following description) is not on the line normal to the first optical reflective layer which passes through the center of gravity of the area of the first optical reflective layer.

When the n-type compound semiconductor layer is formed on the substrate including the first optical reflective layer formed thereon on the basis of lateral growth using a method of epitaxial growth in the lateral direction such as an epitaxial lateral overgrowth (ELO) method, a lot of crystalline defects may occur at a portion of the first optical reflective layer where regions of the n-type compound semiconductor layer meet as the n-type compound semiconductor layer is epitaxially grown from edge portions of the first optical reflective layer toward a central portion of the first optical reflective layer. When the meeting portion having a lot of crystalline defects is positioned at a central portion of the device region (which is described later), this may cause adverse effects on the characteristics of the surface-emitting laser device. It is possible to completely suppress the occurrence of adverse effects on the characteristics of the surface-emitting laser device by employing the form in which the center of gravity of the area of a second optical reflective layer is not on a line normal to a first optical reflective layer which passes through the center of gravity of the area of the first optical reflective layer or the form in which the center of gravity of the area of the active layer is not on the line normal to the first optical reflective layer which passes through the center of gravity of the area of the first optical reflective layer as described above.

The surface-emitting laser device of embodiment 5 or embodiments 6 to 10 described later may be provided in a form such that light generated from the active layer is emitted outside via the second optical reflective layer (which is hereinafter referred to as a "second optical reflective layer emitting type of surface-emitting laser device" for the sake of convenience) and may be provided in a form such that light generated from the active layer is emitted outside via the first optical reflective layer (which is hereinafter referred to as a "first optical reflective layer emitting type of surface-emitting laser device" for the sake of convenience). In the first optical reflective layer emitting type of surface-emitting laser device, the substrate may be removed in some cases as described above.

When $S_i$ represents the area of a portion of the first optical reflective layer which is in contact with the first surface of the n-type compound semiconductor layer (i.e., a portion thereof which is opposite to the second optical reflective layer) and $S_2$ represents the area of a portion of the second optical reflective layer which is opposite to the second surface of the p-type compound semiconductor layer (i.e., a portion thereof which is opposite to the first optical reflective layer), it is desirable, but not necessary, that $S_1 > S_2$ be satisfied in the case of the first optical reflective layer emitting type of surface-emitting laser device and it is desirable, but not necessary, that $S_1 < S_2$ be satisfied in the case of the second optical reflective layer emitting type of surface-emitting laser device.

Further, when $S_3$ represents the area of a portion of the first optical reflective layer which is in contact with the first surface of the n-type compound semiconductor layer (i.e., a portion thereof which is opposite to the second optical reflective layer) and which constitutes the device region (described later) and $S_4$ represents the area of a portion of the second optical reflective layer which is opposite to the second surface of the p-type compound semiconductor layer (i.e., a portion thereof which is opposite to the first optical reflective layer) and which constitutes the device region in the form in which the center of gravity of the area of the second optical reflective layer is not on the line normal to the first optical reflective layer which passes through the center of gravity of the area of the first optical reflective layer or in the form in which the center of gravity of the area of the active layer is not on the line normal to the first optical reflective layer which passes through the center of gravity of the area of the first optical reflective layer, it is desirable, but not necessary, that $S_3>S_4$ be satisfied in the case of the first optical reflective layer emitting type of surface-emitting laser device and it is desirable, but not necessary, that $S_3<S_4$ be satisfied in the case of the second optical reflective layer emitting type of surface-emitting laser device.

The surface-emitting laser device of embodiment 5 or embodiments 6 to 10 described later may be provided in a form such that the second optical reflective layer is fixed to the support substrate as described above in the case where the substrate is removed in the first optical reflective layer emitting type of surface-emitting laser device. The n-side electrode may be formed on an exposed surface of the substrate in the case where the substrate is not removed in the first optical reflective layer emitting type of surface-emitting laser device. As an arrangement of the first optical reflective layer and the n-side electrode on the first surface of the n-type compound semiconductor layer in the case where the substrate is removed, it is possible to employ an arrangement in which the first optical reflective layer and the n-side electrode are in contact with each other or alternatively an arrangement in which the first optical reflective layer and the n-side electrode are spaced apart from each other or an arrangement in which the n-side electrode is also formed over or under an edge portion of the first optical reflective layer in some cases. As an alternative, it is possible to employ a configuration in which the first optical reflective layer and the n-side electrode are spaced apart from each other, i.e., have an offset therebetween, and the spacing distance is within 1 mm.

In addition, the surface-emitting laser device of the present disclosure including the various preferable forms described above and configurations described above may be provided in a form such that the n-side electrode is made of metal, alloy, or a transparent conductive material and the p-side electrode is made of a transparent conductive material. By making the p-side electrode of a transparent conductive material, it is possible to spread current in the horizontal direction (i.e., in the surface direction of the p-type compound semiconductor layer) and to efficiently supply current to the device region (which is described below).

"Device region" refers to a region (current confinement region) into which confined current is injected, a region within which light is confined due to a refractive index difference or the like, a region in which laser oscillation occurs within a region between the first optical reflective layer and the second optical reflective layer, or a region which actually contributes to laser oscillation within the region between the first optical reflective layer and the second optical reflective layer.

The surface-emitting laser device may be configured such that it is made of a surface-emitting laser device which emits light from a top surface of an n-type compound semiconductor layer via a first optical reflective layer or may be configured such that it is made of a surface-emitting laser device which emits light from a top surface of a p-type compound semiconductor layer via a second optical reflective layer.

It is preferable that a current confinement structure be formed between the p-side electrode and the p-type compound semiconductor layer. To obtain the current confinement structure, a current confinement layer which is made of an insulating material (for example, $SiO_X$, $SiN_X$, or $AlO_X$) may be formed between the p-side electrode and the p-type compound semiconductor layer, a mesa structure may be formed by etching the p-type compound semiconductor layer using an RIE method or the like, a current confinement region may be formed by oxidizing a partial layer of the laminated layers of the p-type compound semiconductor layer partially in the horizontal direction, a region with reduced conductivity may be formed by performing ion implantation of impurities into the p-type compound semiconductor layer, or a combination of these methods may be employed as appropriate. Here, the p-side electrode needs to be electrically connected to a portion of the p-type compound semiconductor layer where current flows by current confinement.

For example, the support substrate may be constructed of various substrates such as a GaN substrate, a sapphire substrate, a GaAs substrate, a SiC substrate, an alumina substrate, a ZnS substrate, a ZnO substrate, a LiMgO substrate, a $LiGaO_2$ substrate, a $MgAl_2O_4$ substrate, and an InP substrate or may be constructed of an insulating substrate made of AlN or the like, a semiconductor substrate made of Si, SiC, Ge, or the like, or a metal or alloy substrate, and, as the support substrate, it is preferable to use a substrate having conductivity or it is preferable to use a metal or alloy substrate from the viewpoint of mechanical characteristics, elastic deformation, plastic deformation characteristics, heat radiation characteristics, or the like. The thickness of the support substrate may be exemplified, for example, as 0.05 to 0.5 mm. As a method of fixing the second optical reflective layer to the support substrate, it is possible to use a known method such as a solder bonding method, a room-temperature bonding method, a bonding method using an adhesive tape, or a bonding method using wax bonding and it is desirable that a solder bonding method or a room-temperature bonding method be employed from the viewpoint of securing a conductivity. For example, in the case where a silicon semiconductor substrate which is a conductive substrate is used as the support substrate, it is desirable that a method in which bonding is possible at a low temperature equal to or less than 400° C. be employed in order to suppress warping due to the difference in the coefficients of thermal expansion. In the case where a GaN substrate is used as the support substrate, the bonding temperature may be equal to or greater than 400° C.

The n-side electrode preferably has a single layer configuration or a multilayer configuration including at least one type of metal (including alloys) selected from the group consisting of, for example, gold (Au), silver (Ag), palladium (Pd), platinum (Pt), nickel (Ni), Ti (titanium), vanadium (V), tungsten (W), chromium (Cr), aluminum (Al), copper (Cu), zinc (Zn), tin (Sn), and indium (In), which may be specifically exemplified, for example, by Ti/Au, Ti/Al, Ti/Al/Au, Ti/Pt/Au, Ni/Au, Ni/Au/Pt, Ni/Pt, Pd/Pt, and Ag/Pd. Here, a layer prior to "/" is positioned closer to the active layer than a layer subsequent to "/" in the multilayer configuration. This refers to the same in the following description. The n-side electrode may be deposited, for example, using a PVD method such as a vacuum evaporation method or a sputtering method.

A transparent conductive material that constitutes the n-side electrode or the p-side electrode may be exemplified by indium-tin oxide (ITO including Sn-doped $In_2O_3$, crystalline ITO, and amorphous ITO), indium-zinc oxide (IZO), indium-gallium oxide (IGO), indium-doped gallium-zinc oxide (IGZO, In—GaZnO$_4$), IFO (F-doped In$_2$O$_3$), tin oxide (SnO$_2$), ATO (Sb-doped SnO$_2$), FTO (F-doped SnO$_2$), zinc oxide (ZnO including Al-doped ZnO or B-doped ZnO). As the p-side electrode, it is possible to employ a transparent conductive film that includes, as a base layer, gallium oxide, titanium oxide, niobium oxide, nickel oxide, or the like. A material which constitutes the p-side electrode is not limited to a transparent conductive material and, as the material, it is possible to use a metal such as palladium (Pd), platinum (Pt), nickel (Ni), gold (Au), cobalt (Co), rhodium (Rh), or the like, depending on the arrangement of the second optical reflective layer and the p-side electrode. The p-side electrode may be constructed of at least one of these material types. The p-side electrode may be deposited, for example, using a PVD method such as a vacuum evaporation method or a sputtering method.

A pad electrode may be provided on the n-side electrode or the p-side electrode to electrically connect the n-side electrode or the p-side electrode to an external electrode or circuit. It is desirable that the pad electrode have a single layer configuration or a multilayer configuration including at least one type of metal selected from the group consisting of titanium (Ti), aluminum (Al), platinum (Pt), gold (Au), nickel (Ni), and palladium (Pd). As an alternative, the pad electrode may have a multilayer configuration which is exemplified by a Ti/Pt/Au multilayer configuration, a Ti/Au multilayer configuration, a Ti/Pd/Au multilayer configuration, a Ti/Pd/Au multilayer configuration, a Ti/Ni/Au multilayer configuration, and a Ti/Ni/Au/Cr/Au multilayer configuration. In the case where the n-side electrode is constructed of an Ag layer or an Ag/Pd layer, it is preferable that a cover metal layer which is made of, for example, Ni/TiW/Pd/TiW/Ni be formed on a surface of the n-side electrode and a pad electrode which is made of, for example, a multilayer configuration of Ti/Ni/Au or a multilayer configuration of Ti/Ni/Au/Cr/Au be formed on the cover metal layer.

The optical reflective layer (distributed Bragg reflector (DBR) layer) is constructed of, for example, a semiconductor multilayer film or a dielectric multilayer film. The dielectric material may be exemplified, for example, by an oxide such as Si, Mg, Al, Hf, Nb, Zr, Sc, Ta, Ga, Zn, Y, B, or Ti, a nitride (for example, SiN$_X$, AlN$_X$, AlGaN, GaN$_X$, or BN$_X$), a fluoride, or the like. Specifically, the dielectric material may be exemplified by SiO$_X$, TiO$_X$, NbO$_X$, ZrO$_X$, TaO$_X$, ZnO$_X$, AlO$_X$, HfO$_X$, SiN$_X$, AlN$_X$, or the like. The optical reflective layer may be obtained by alternately laminating two or more types of dielectric films that are made of dielectric materials with different refractive indices among those dielectric materials. It is preferable to employ a dielectric multilayer film such as, for example, SiO$_X$/SiN$_Y$, SiO$_X$/NbO$_Y$, SiO$_X$/ZrO$_Y$, or SiO$_X$/AlN$_Y$. A material which constitutes each dielectric film, the thickness, the number of laminated layers, or the like of each dielectric film may be selected as appropriate to obtain a desired optical reflectance. The thickness of each dielectric film may be appropriately adjusted by the material used or the like and is determined by the emission wavelength $\lambda_0$ and a refractive index n of the material used at the emission wavelength $\lambda_0$. Specifically, the thickness of each dielectric film is preferably an odd multiple of $\lambda_0/(4n)$. For example, in a surface-emitting laser device with an emission wavelength $\lambda_0$ of 450 nm, the thickness may be exemplified as 40 to 70 nm when the optical reflective layer is constructed of SiO$_X$/NbO$_Y$. The number of laminated layers may be exemplified as 2 or more, preferably about 5 to about 20. The total thickness of the optical reflective layer may be exemplified, for example, as about 0.6 to about 1.7 µm.

As an alternative, it is desirable that the first optical reflective layer have a dielectric film including at least nitrogen (N) atoms and it is desirable that the dielectric film including nitrogen atoms be the top layer of the dielectric multilayer film. As an alternative, it is desirable that the first optical reflective layer be covered with a dielectric material layer including at least nitrogen atoms. As an alternative, it is desirable that the surface of the first optical reflective layer be made into a layer including at least nitrogen atoms (hereinafter referred to as a "surface layer") by performing a nitridation process on the surface of the first optical reflective layer. It is preferable that the thickness of the dielectric film or the dielectric material layer including at least nitrogen atoms (i.e., the surface layer) be an odd multiple of $\lambda_0/(4n)$. Specifically, as a material that constitutes the dielectric film or the dielectric material layer including at least nitrogen atoms, it is possible to employ SiN$_X$, SiO$_X$N$_Z$, or the like. When a compound semiconductor layer which covers the first optical reflective layer is formed by forming a dielectric film or a dielectric material layer including at least nitrogen atoms (i.e., a surface layer), it is possible to improve the offset between the crystalline axis of the compound semiconductor layer that covers the first optical reflective layer and the crystalline axis of the GaN substrate and it is possible to increase the quality of the laminate structural body which becomes a resonator.

The optical reflective layer may be formed on the basis of a well-known method which may be specifically exemplified, for example, by a PVD method such as a vacuum evaporation method, a sputtering method, a reactive sputtering method, an ECR plasma sputtering method, a magnetron sputtering method, an ion beam assisted evaporation method, an ion plating method, or a laser ablation method; various CVD methods; a coating method such as a spraying method, a spin coating method, or a dipping method; a combination of two or more of these methods; a combination of these methods with one or more of overall or partial pretreatment, irradiation with inert gas (Ar, He, Xe or the like) or plasma, irradiation with oxygen or ozone gas or plasma, an oxidation process (heat treatment), and an exposure process.

In addition, it is preferable that the substrate be constructed of a GaN substrate, the off-angle of the surface orientation of the surface of the GaN substrate be within 0.4°, preferably within 0.40°, the area of the first optical reflective layer be equal to or less than 0.8S$_0$ when S$_0$ represents the area of the GaN substrate, and a thermal expansion mitigation film be formed as a bottom layer of the first optical reflective layer on the GaN substrate or the coefficient of linear thermal expansion (CTE) of the bottom layer of the first optical reflective layer which is in contact with the GaN substrate satisfy the following:

$1 \times 10^{-6}/K \leq CTE \leq 1 \times 10^{-6}/K$, preferably $1 \times 10^{-6}/K < CTE \leq 1 \times 10^{-6}/K$.

It is possible to reduce the surface roughness of the p-type compound semiconductor layer by predefining the proportion of the area of the first optical reflective layer and the off-angle of the surface orientation of the crystalline surface of the surface of the GaN substrate in this manner. That is, it is possible to form a p-type compound semiconductor layer with preferable surface morphology. Therefore, it is possible to obtain a second optical reflective layer with high flatness. That is, it is possible to obtain a desired optical reflectance and it is difficult for variations in the characteristics to occur. In addition, by forming a thermal expansion mitigation film or predefining the CTE value, it is possible to avoid the occurrence of the problem of separation of the first optical reflective layer from the GaN substrate due to the difference in the coefficient of linear thermal expansion between the GaN substrate and the first optical reflective layer, and it is thus possible to provide a highly reliable surface-emitting laser device. Further, when the GaN substrate is used, it is difficult for dislocations in the compound semiconductor layer to occur and it is possible to avoid the problem of the increase in the thermal resistance of the surface-emitting laser device. Therefore, it is possible to give high reliability to the surface-emitting laser device and it is also possible to provide an n-side electrode at a side of the GaN substrate (i.e., at a rear surface side of the substrate) different from the side thereof at which the p-side electrode is provided.

The term "off-angle of the surface orientation of the surface of the GaN substrate" refers to an angle formed by the surface orientation of the surface of the GaN substrate and a line which is normal to the surface of the GaN substrate when viewed macroscopically. When $S_0$ represents the area of the GaN substrate, it is predefined that the area of the first optical reflective layer be equal to or less than $0.8S_0$, where the term "area $S_0$ of the GaN substrate" refers to an area of the GaN substrate that remains when a final surface-emitting laser device has been obtained. In these cases, the bottom layer of the first optical reflective layer does not function as an optical reflective layer.

It is possible to provide a form in which the thermal expansion mitigation film is made of at least one type of material selected from the group consisting of silicon nitride ($SiN_X$), aluminum oxide ($AlO_X$), niobium oxide ($NbO_X$), tantalum oxide ($TaO_X$), titanium oxide ($TiO_X$), magnesium oxide ($MgO_X$), zirconium oxide ($ZrO_X$), and aluminum nitride ($AlN_X$). The values of the suffix "X" added to the chemical formula of each material or suffixes "Y" and "Z" which are described later include not only values based on stoichiometry but also values other than values based on stoichiometry. This refers to the same in the following description. When $t_1$ represents the thickness of the thermal expansion mitigation film, $\lambda_0$ represents the emission wavelength of the surface-emitting laser device, and $n_1$ represents the refractive index of the thermal expansion mitigation film, it is desirable to satisfy the following:

$$t_1 = \lambda_0/(4n_1),$$

preferably $t_1 = \lambda_0/(\lambda n_1)$.

Here, the value of the thickness $t_1$ of the thermal expansion mitigation film may be essentially arbitrary and may be, for example, equal to or less than $1 \times 10^{-7}$ m.

It is possible to provide a form in which the bottom layer of the first optical reflective layer is made of at least one type of material selected from the group consisting of silicon nitride ($SiN_X$), aluminum oxide ($AlO_X$), niobium oxide ($NbO_X$), tantalum oxide ($TaO_X$), titanium oxide ($TiO_X$), magnesium oxide ($MgO_X$), zirconium oxide ($ZrO_X$), and aluminum nitride ($AlN_X$). When $t_1$ represents the thickness of the bottom layer of the first optical reflective layer, $\lambda_0$ represents the emission wavelength of the surface-emitting laser device, and $n_1$ represents the refractive index of the bottom layer of the first optical reflective layer, it is desirable to satisfy the following:

$$t_1 = \lambda_0/(4n_1),$$

preferably $t_1 = \lambda_0/(2n_1)$.

Here, the value of the thickness $t_1$ of the bottom layer of the first optical reflective layer may be essentially arbitrary and may be, for example, equal to or less than $1 \times 10^{-7}$ m.

The surface-emitting laser device of embodiment 5 will now be described.

In the surface-emitting laser device of embodiment 5, the plan shape of the first optical reflective layer 51 is a regular hexagon. The regular hexagon is disposed or arranged such that the compound semiconductor layer is epitaxially grown laterally in the [11-20] direction or in the same crystalline direction as the [11-20] direction. However, the shape of the first optical reflective layer 51 is not limited to a regular hexagon but may be, for example, a circle, a grid, or a stripe.

The laminate structural body 20 includes an n-type compound semiconductor layer 21, an active layer 23, and a p-type compound semiconductor layer 22 which are made of a GaN-based compound semiconductor. More specifically, the laminate structural body 20 is made by laminating:

an n-type compound semiconductor layer 21 which is made of a GaN-based compound semiconductor and has a first surface 21a and a second surface 21b opposite to the first surface 21a;

an active layer (light emitting layer) 23 which is made of a GaN-based compound semiconductor and is in contact with the second surface 21b of the n-type compound semiconductor layer 21; and a p-type compound semiconductor layer 22 which is made of a GaN-based compound semiconductor and has a first surface 22a that is in contact with the active layer 23 and a second surface 22b opposite to the first surface 22a.

The p-side electrode 42 and the second optical reflective layer 52, which is made of a dielectric multilayer film, are formed on the second surface 22b of the p-type compound semiconductor layer 22 and the n-side electrode 41 is formed on one surface 11b of the substrate 11 which is opposite to the other surface 11a of the substrate 11 on which the laminate structural body 20 has been formed. The first optical reflective layer 51 which is made of a dielectric multilayer film is formed on the surface 11a of the substrate 11 such that the first optical reflective layer 51 is in contact with the first surface 21a of the n-type compound semiconductor layer 21.

Here, the surface-emitting laser device of embodiment 5 is made of a surface-emitting laser device that emits light from the top surface of the p-type compound semiconductor layer 22 via the second optical reflective layer 52. Specifically, the surface-emitting laser device of embodiment 5 is a second optical reflective layer emitting type of surface-emitting laser device which emits light from the second surface 22b of the p-type compound semiconductor layer 22 via the second optical reflective layer 52. The substrate 11 remains. The configuration and structure of the laminate structural body 20 may be substantially the same as those of the laminate structural body 20 in the surface-emitting laser device described in embodiments 1 to 3.

In the surface-emitting laser device of embodiment 5 or embodiments 6 to 10 described later, a current confinement layer 43 which is made of an insulating material such as $SiO_X$, $SiN_X$, or $AlO_X$ is formed between the p-side electrode 42 and the p-type compound semiconductor layer 22. An opening 43A is formed in the current confinement layer 43 and the p-type compound semiconductor layer 22 is exposed at the bottom of the opening 43A. The p-side electrode 42 is formed on the second surface 22b of the p-type compound semiconductor layer 22 over the current confinement layer 43 and the second optical reflective layer 52 is formed on the p-side electrode 42. A pad electrode 44 for electrical connection to an external electrode or circuit is connected to the top of an edge portion of the p-side electrode 42. In the surface-emitting laser device of embodiment 5 or embodiments 6 and 7 described later, the plan shape of the first optical reflective layer 51 is a regular hexagon and the plan shape of each of the second optical reflective layer 52 and the opening 43A formed in the current confinement layer 43 is a circle. The first optical reflective layer 51 and the second optical reflective layer 52 are each shown as a single layer for simple illustration although each has a multilayer structure. The shape of the current confinement layer 43 is not essential.

In the surface-emitting laser device of embodiment 5, the distance between the first optical reflective layer 51 and the second optical reflective layer 52 is equal to or greater than 0.15 μm and equal to or less than 50 μm and is specifically 10 μm, for example. A line which is normal to the first optical reflective layer 51 and passes through the center of gravity of the area of the first optical reflective layer 51 is denoted by $LN_1$ and a line which is normal to the second optical reflective layer 52 and passes through the center of gravity of the area of the second optical reflective layer 52 is denoted by $LN_2$, and $LN_1$ and $LN_2$ coincide with each other in the example shown in FIG. 2A.

The n-type compound semiconductor layer 21 is made of an n-type GaN layer which is 5 μm thick, the active layer 23 has the configuration and structure described in embodiments 1 to 3, and the p-type compound semiconductor layer 22 is configured in two layers, a p-type AlGaN electron barrier layer (which is 10 nm thick) and a p-type GaN layer. The electron barrier layer is positioned at the side of the active layer. The n-side electrode 41 is made of Ti/Pt/Au and the p-side electrode 42 is made of a transparent dielectric material, specifically of ITO, the pad electrode 44 is made of Ti/Pd/Au or Ti/Pt/Au, and the first optical reflective layer 51 and the second optical reflective layer 52 are each made in a laminate structure of $SiN_X$ and $SiO_Y$ layers (where the total number of laminated layers of the dielectric multilayer film is 20) with each layer being $\lambda_0/(4n)$ thick.

In the surface-emitting laser device of embodiment 5, $S_1<S_2$ is satisfied when $S_1$ represents the area of a portion of the first optical reflective layer 51 which is in contact with the first surface 21a of the n-type compound semiconductor layer 21 (i.e., a portion thereof which is opposite to the second optical reflective layer 52) and $S_2$ represents the area of a portion of the second optical reflective layer 52 which is opposite to the second surface 22b of the p-type compound semiconductor layer 22 (i.e., a portion thereof which is opposite to the first optical reflective layer 51).

Figure 3A:
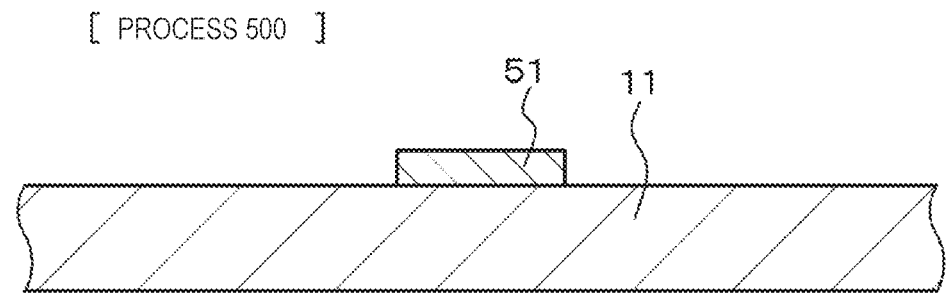
FIGS. 3A, 3B, and 3C are schematic partial sectional views of a substrate or the like for explaining a method of manufacturing a surface-emitting laser device of embodiment 5.

A method of manufacturing a surface-emitting laser device of embodiment 5 will now be described on the basis of FIGS. 3A, 3B, and 3C which are schematic partial sectional views of a substrate or the like.

[Process 500]

A first optical reflective layer 51 is formed on a substrate (specifically, a GaN substrate) 11. Specifically, first, a dielectric multilayer film is formed on the substrate 11 over the entire surface thereof on the basis of a sputtering method and is then patterned on the basis of a photolithography technology and a dry etching technology to obtain a first optical reflective layer 51 (see FIG. 3A).

[Process 510]

Thereafter, an n-type compound semiconductor layer 21, an active layer 23, and a p-type compound semiconductor layer 22 are formed over the entire surface. Specifically, an n-type compound semiconductor layer 21 which is made of n-type GaN is formed over the entire surface on the basis of an MOCVD method, which applies epitaxial growth in the lateral direction, such as an ELO method (using TMG gas and $SiH_4$ gas). Subsequently, an active layer 23 and a p-type compound semiconductor layer 22 are formed over the entire surface. Specifically, an active layer 23 is formed on the n-type compound semiconductor layer 21 using TMG gas and TMI gas on the basis of an epitaxial growth method, and thereafter an electron barrier layer is formed using TMG gas, TMA gas, and $Cp_2Mg$ gas and a p-type GaN layer is formed using TMG gas and $Cp_2Mg$ gas to obtain a p-type compound semiconductor layer 22. The laminate structural body 20 can be obtained through the above processes. That is, the laminate structural body 20 is epitaxially grown on the substrate (specifically, GaN substrate) 11 including the first optical reflective layer 51, the laminate structural body 20 being made by laminating: an n-type compound semiconductor layer 21 which is made of a GaN-based compound semiconductor and has a first surface 21a and a second surface 21b opposite to the first surface 21a; an active layer 23 which is made of a GaN-based compound semiconductor and is in contact with the second surface 21b of the n-type compound semiconductor layer 21; and a p-type compound semiconductor layer 22 which is made of a GaN-based compound semiconductor and has a first surface 22a that is in contact with the active layer 23 and a second surface 22b opposite to the first surface 22a.

Figure 3B:
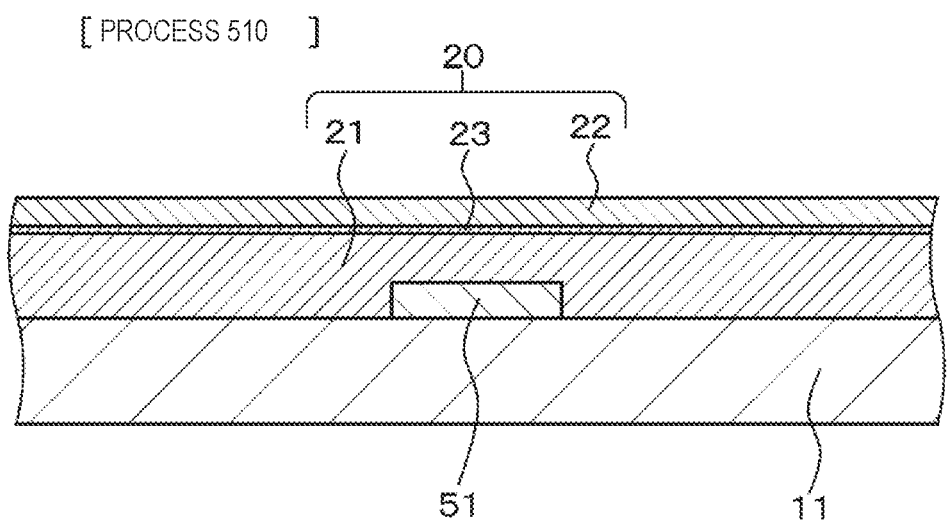
Figure 3C:
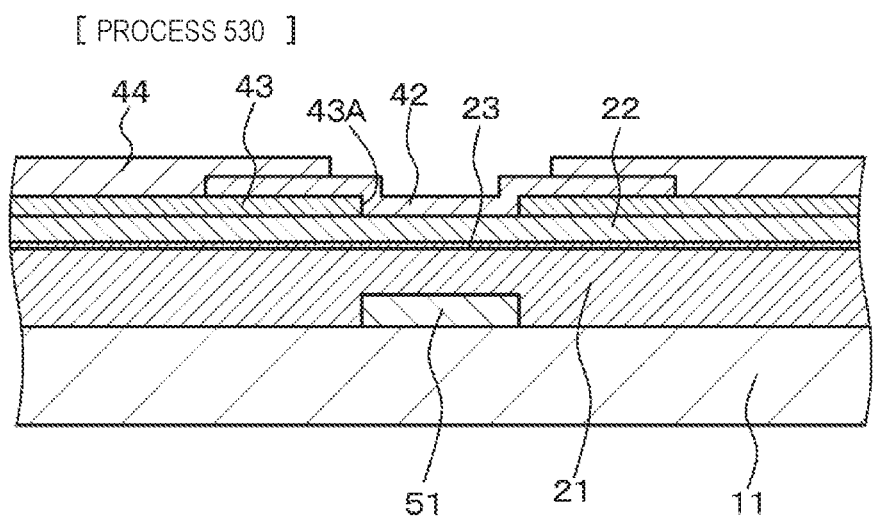

The structure shown in FIG. 3B can be obtained in this manner.

[Process 520]

Then, a current confinement layer 43, which is made of a 0.2 μm thick insulating material and has an opening 43A, is formed on the second surface 22b of the p-type compound semiconductor layer 22 on the basis of a well-known method.

[Process 530]

Thereafter, a p-side electrode and a second optical reflective layer which are opposite to the first optical reflective layer 51 are formed on the p-type compound semiconductor layer 22. Specifically, a p-side electrode 42 and a second optical reflective layer 52 which is made of a dielectric multilayer film are formed on the second surface 22b of the p-type compound semiconductor layer 22. More specifically, a p-side electrode 42 which is made of a 50 nm thick ITO layer is formed on the second surface 22b of the p-type compound semiconductor layer 22 over the current confinement layer 43, for example, on the basis of a liftoff method and a pad electrode 44 is formed on the p-side electrode 42 over the current confinement layer 43 on the basis of a well-known method. The structure shown in FIG. 3C can be obtained in this manner. Thereafter, a second optical reflective layer 52 is formed on the p-side electrode 42 over the pad electrode 44 on the basis of a well-known method. On the other hand, an n-side electrode 41 is formed on the other surface 11b of the substrate 11 on the basis of a well-known method. A surface-emitting laser device of embodiment 5 having the structure shown in FIG. 2A can be obtained in this manner.

[Process 540]

Thereafter, the surface-emitting laser device is separated by performing so-called device separation and the side surface or the exposed surface of the laminate structural body 20 is covered, for example, with an insulating film which is made of SiOx. A terminal or the like is formed on the basis of a well-known method to connect the n-side electrode 41 or the pad electrode 44 to an external circuit or the like and packaging or sealing is performed to complete a surface-emitting laser device of embodiment 5.

As described above, when the n-type compound semiconductor layer 21 is formed on the substrate 11 including the first optical reflective layer 51 formed thereon through lateral growth on the basis of a method of epitaxial growth in the lateral direction such as an epitaxial lateral overgrowth (ELO) method, a lot of crystalline defects may occur at a portion of the first optical reflective layer 51 where regions of the n-type compound semiconductor layer 21 meet as the n-type compound semiconductor layer 21 is epitaxially grown from edge portions of the first optical reflective layer 51 toward a central portion of the first optical reflective layer 51.

Figure 2A:
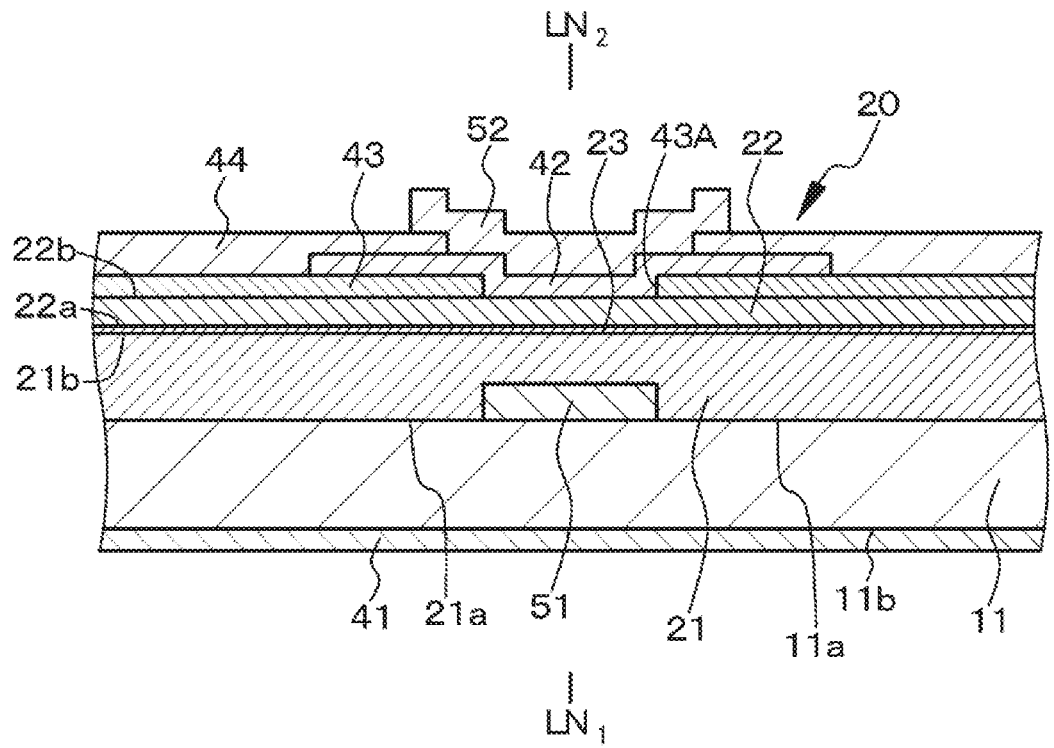
FIGS. 2A and 2B are schematic partial sectional views of an optical semiconductor device of embodiment 5 and a modified example thereof.
Figure 2B:
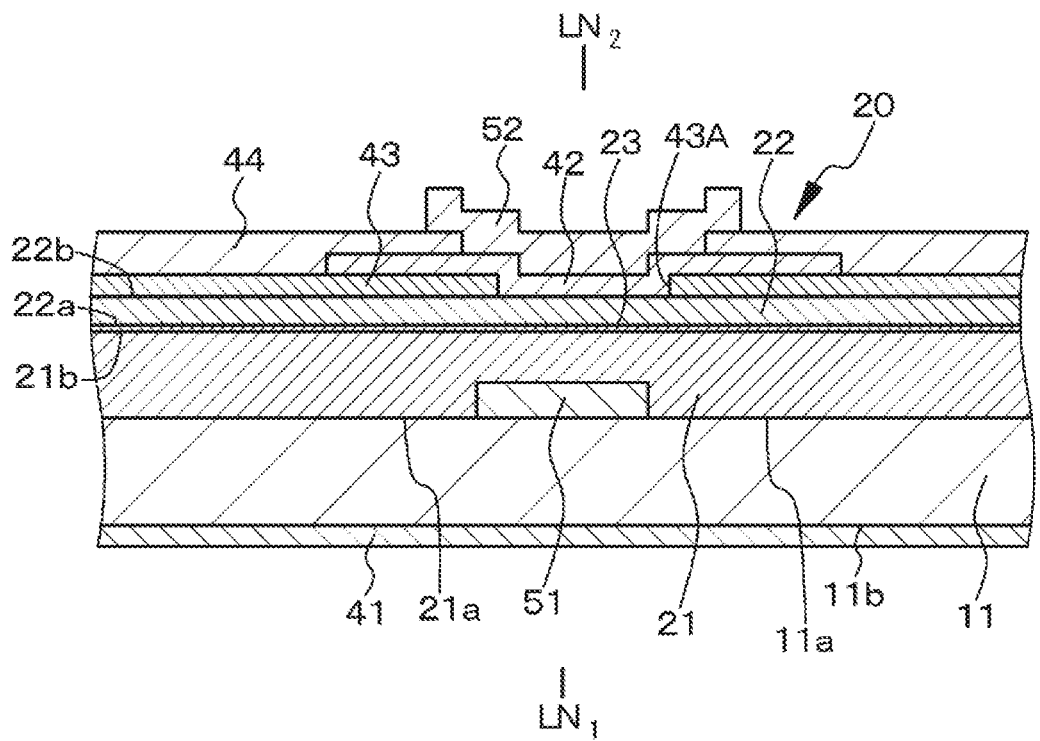

In a surface-emitting laser device of a modified example of embodiment 5, as shown in FIG. 2B, the center of gravity of the area of a second optical reflective layer 52 is not on a line $LN_1$ normal to a first optical reflective layer 51 which passes through the center of gravity of the area of the first optical reflective layer 51. A line $LN_2$ normal to the second optical reflective layer 52 which passes through the center of gravity of the area of the second optical reflective layer 52 coincides with a line normal to the active layer 23 which passes through the center of gravity of the area of the active layer 23 (specifically, the center of gravity of an area of the active layer 23 which constitutes a device region). In other words, the center of gravity of the area of the active layer 23 is not on the line $LN_1$ normal to the first optical reflective layer 51 which passes through the center of gravity of the area of the first optical reflective layer 51. This prevents the meeting portion having a lot of crystalline defects (specifically, a portion positioned at or near the normal line $LN_1$) from being positioned at a central portion of the device region and prevents or reduces adverse effects on the characteristics of the surface-emitting laser device. In addition, $S_3 < S_4$ is satisfied when $S_3$ represents the area of a portion of the first optical reflective layer 51, which is in contact with the first surface 21a of the n-type compound semiconductor layer 21 (i.e., a portion thereof which is opposite to the second optical reflective layer 52) and constitutes the device region, and $S_4$ represents the area of a portion of the second optical reflective layer 52 which is opposite to the second surface 22b of the p-type compound semiconductor layer 22 (i.e., a portion thereof which is opposite to the first optical reflective layer 51) and constitutes the device region.

Embodiment 6

Figure 4A:
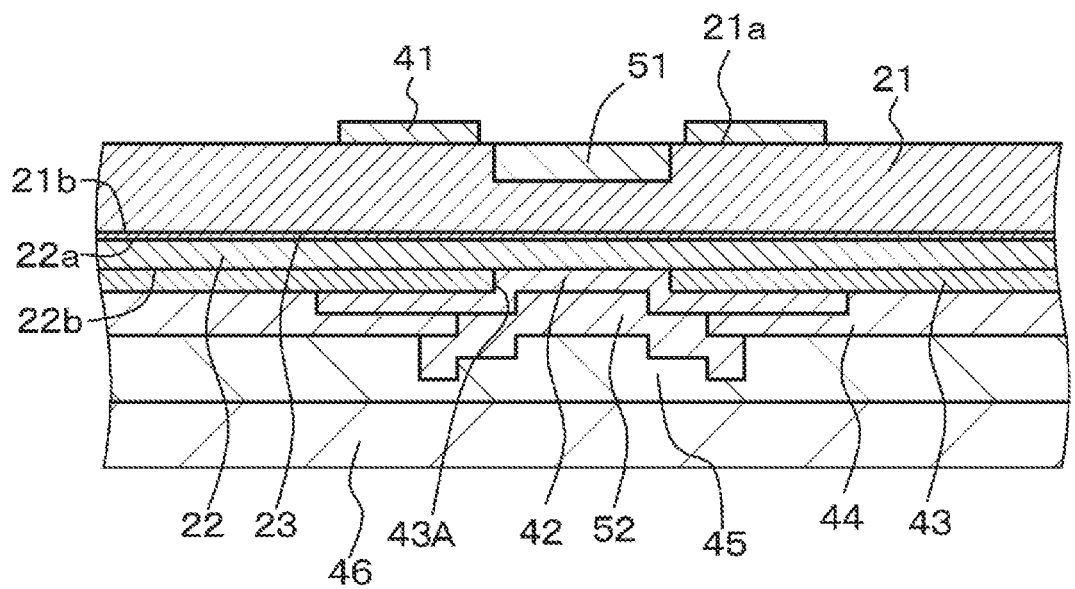
FIGS. 4A and 4B are schematic partial sectional views of a surface-emitting laser device of embodiment 6 and a modified example thereof, respectively.

Embodiment 6 is a modification of embodiment 5. In a surface-emitting laser device of embodiment 6, light generated from an active layer 23 is emitted outside from the top surface of an n-type compound semiconductor layer 21 via a first optical reflective layer 51 as shown in FIG. 4A which is a schematic partial sectional view. That is, the surface-emitting laser device of embodiment 6 is a first optical reflective layer emitting type of surface-emitting laser device. In the surface-emitting laser device of embodiment 6, a second optical reflective layer 52 is fixed to a support substrate 46, which is made of a silicon semiconductor substrate, on the basis of solder bonding via a bonding layer 45 which is made of a solder layer including tin (Sn) or a gold (Au) layer.

In embodiment 6, an active layer 23, a p-type compound semiconductor layer 22, a p-side electrode 42, and a second optical reflective layer 52 are sequentially formed on the n-type compound semiconductor layer 21 and then the second optical reflective layer 52 is fixed to the support substrate 46. Thereafter, the substrate 11 is removed using the first optical reflective layer 51 as a polishing stopper layer to expose the n-type compound semiconductor layer 21 (i.e., a first surface 21a of the n-type compound semiconductor layer 21) and the first optical reflective layer 51. An n-side electrode 41 is then formed on the n-type compound semiconductor layer 21 (i.e., on the first surface 21a of the n-type compound semiconductor layer 21).

The distance between the first optical reflective layer 51 and the second optical reflective layer 52 is equal to or greater than 0.15 μm and equal to or less than 50 μm and is specifically 10 μm, for example. In the surface-emitting laser device of embodiment 6, the first optical reflective layer 51 and the n-side electrode 41 are spaced apart from each other. That is, the first optical reflective layer 51 and the n-side electrode 41 have an offset therebetween. The spacing distance is within 1 mm and is specifically 0.05 mm on average, for example.

Figure 5A:
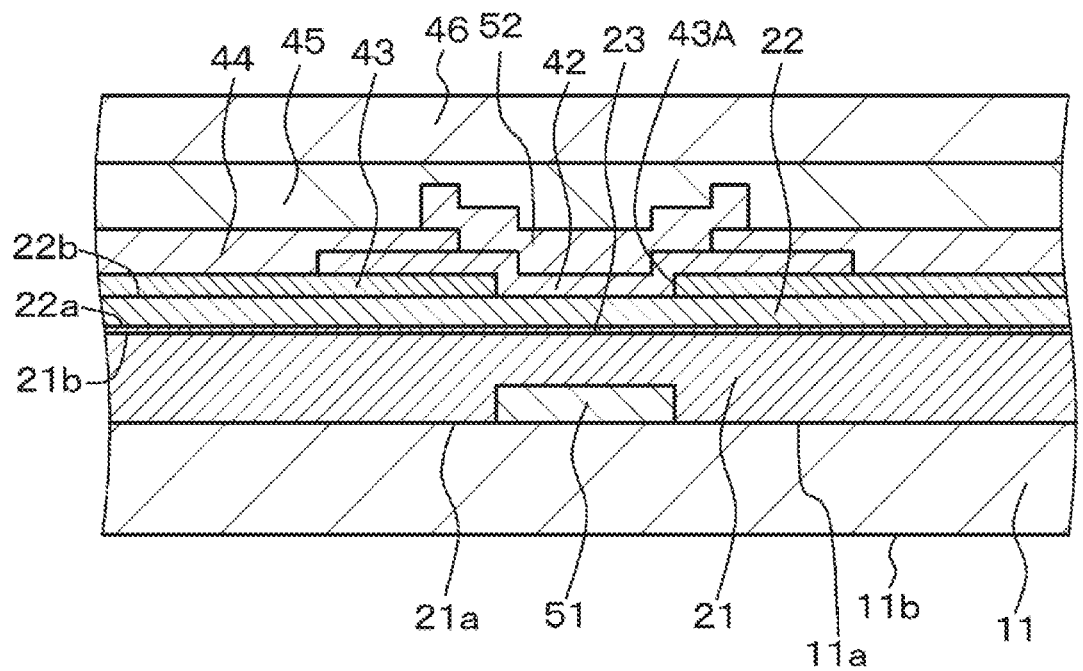
FIGS. 5A and 5B are schematic partial sectional views of a laminate structural body or the like for explaining a method of manufacturing a surface-emitting laser device of embodiment 6.
Figure 5B:
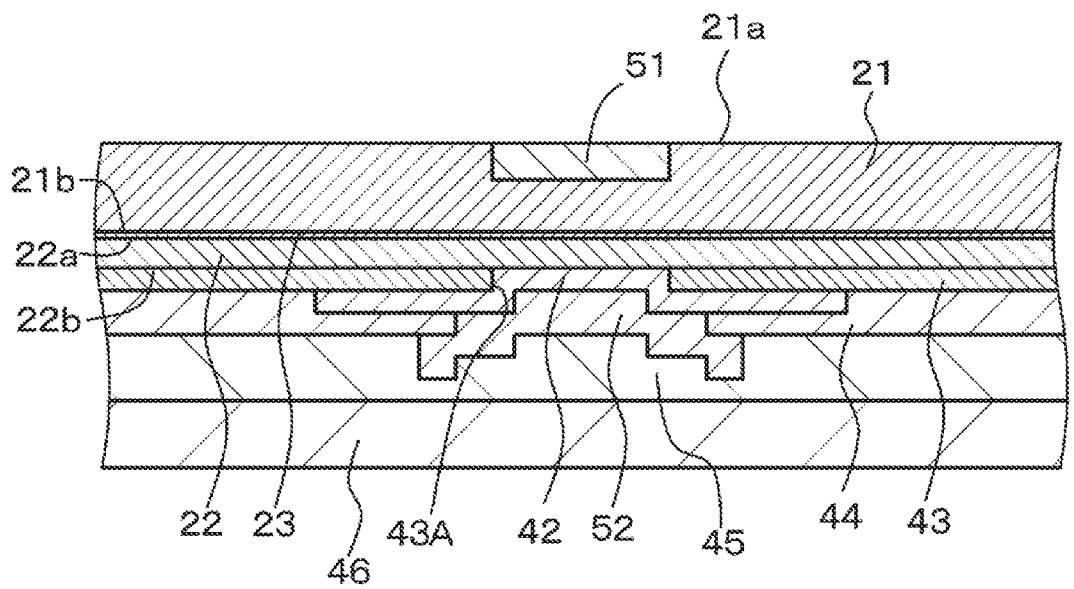

A method of manufacturing a surface-emitting laser device of embodiment 6 will now be described with reference to FIGS. 5A and 5B which are schematic partial sectional views of a laminate structural body or the like.

[Process 600]

First, a structure shown in FIG. 2A is obtained by performing the same processes as [Process 500] to [Process 530] of embodiment 5. However, the n-side electrode 41 is not formed.

[Process 610]

Thereafter, a second optical reflective layer 52 is fixed to a support substrate 46 via a bonding layer 45. The structure shown in FIG. 5A can be obtained in this manner.

[Process 620]

Figure 9A:
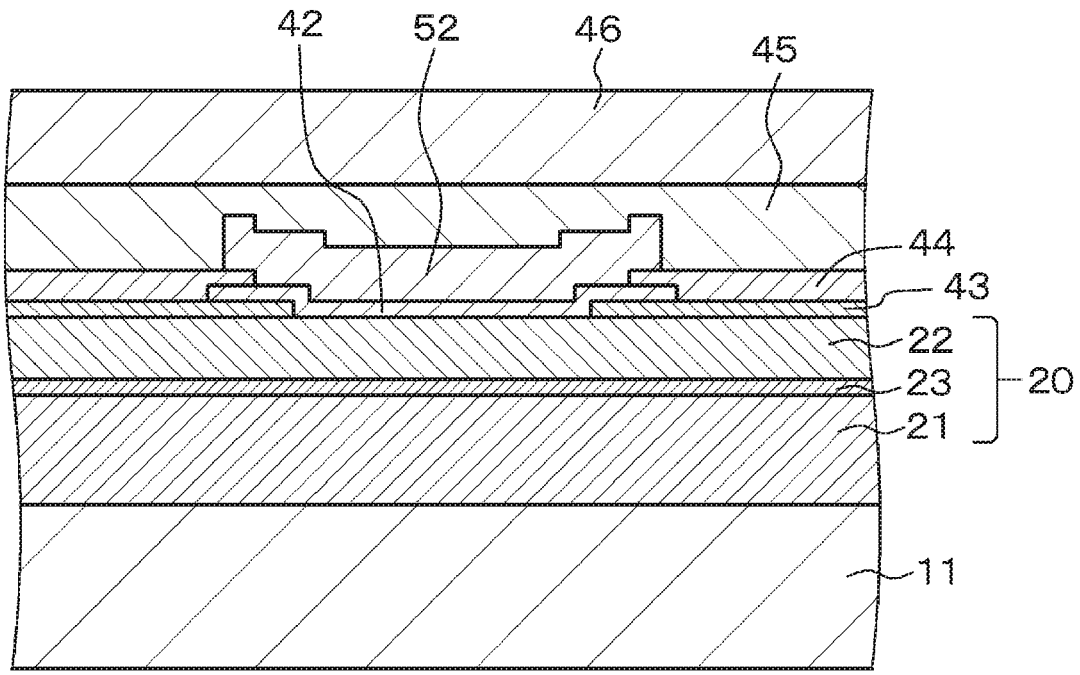
FIGS. 9A and 9B are schematic partial sectional views of a laminate structural body or the like for explaining a method of manufacturing a surface-emitting laser device of embodiment 7, subsequent to FIG. 8C.
Figure 9B:
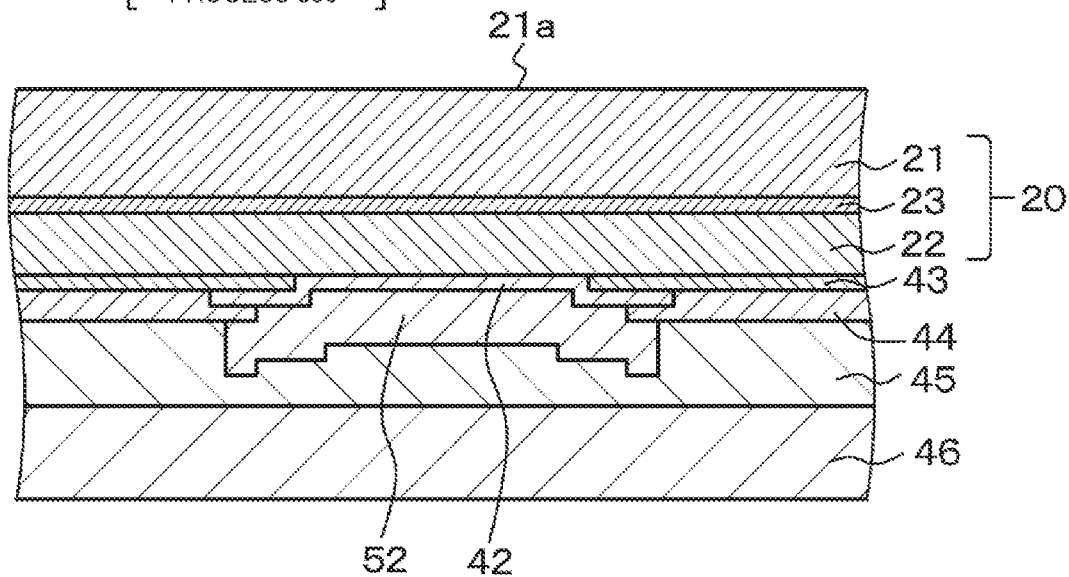
Figure 10:
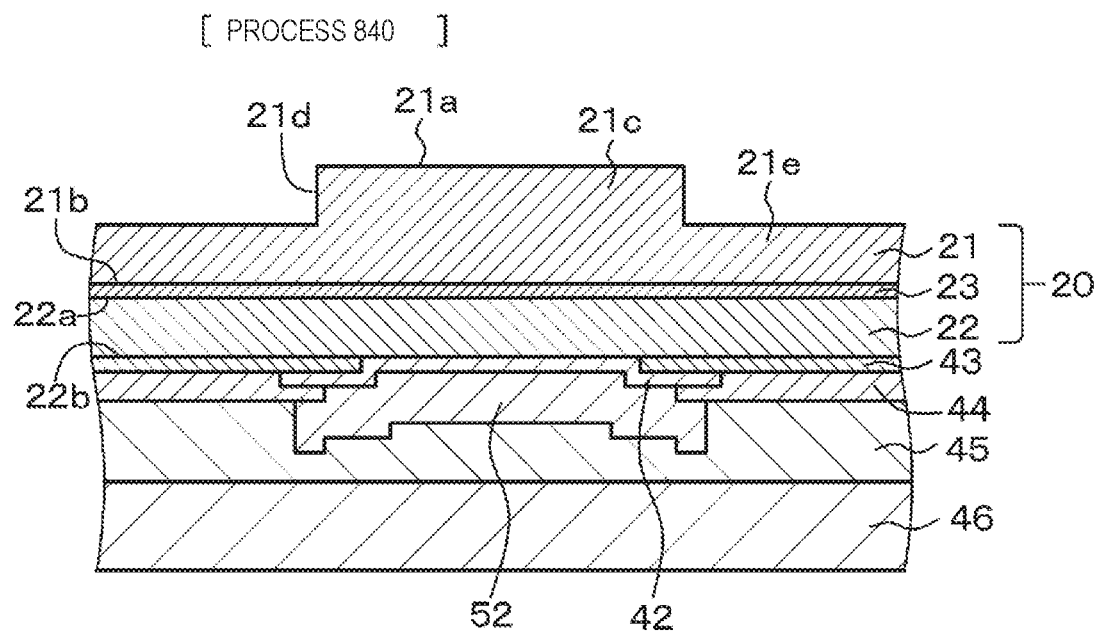
FIG. 10 is a schematic partial sectional view of a laminate structural body or the like for explaining a method of manufacturing a surface-emitting laser device of embodiment 7, subsequent to FIG. 9B.

Then, the substrate (GaN substrate) 11 is removed to expose the first surface 21a of the n-type compound semiconductor layer 21 and the first optical reflective layer 51. Specifically, first, the thickness of the substrate 11 is reduced on the basis of a mechanical polishing method and then a remaining portion of the substrate 11 is removed on the basis of a CMP method. In this manner, the first surface 21a of the n-type compound semiconductor layer 21 and the first optical reflective layer 51 are exposed to obtain a structure shown in FIG. 9B.

[Process 630]

Thereafter, an n-side electrode 41 is formed on the first surface 21a of the n-type compound semiconductor layer 21 on the basis of a well-known method. A surface-emitting laser device of embodiment 6 having the structure shown in FIG. 4A can be obtained in this manner.

[Process 640]

Thereafter, the surface-emitting laser device is separated by performing so-called device separation and the side surface or the exposed surface of the laminate structural body 20 is covered, for example, with an insulating film which is made of SiOx. A terminal or the like is formed on the basis of a well-known method to connect the n-side electrode 41 or the pad electrode 44 to an external circuit or the like and packaging or sealing is performed to complete a surface-emitting laser device of embodiment 6.

In the method of manufacturing the surface-emitting laser device of embodiment 6, the substrate on which the first optical reflective layer has been formed is removed. Therefore, the first optical reflective layer functions as a polishing stopper layer when the substrate is removed. As a result, it is possible to suppress the occurrence of variations in the removal of the substrate within the surface thereof and to suppress the occurrence of variations in the thickness of the n-type compound semiconductor layer and also to achieve uniformity of the length of the resonator. Therefore, it is possible to achieve stabilization of the characteristics of the obtained surface-emitting laser device. In addition, since the surface (flat surface) of the n-type compound semiconductor layer at the interface between the n-type compound semiconductor layer and the first optical reflective layer is flat, light scattering at the flat surface may be minimized as much as possible.

Figure 4B:
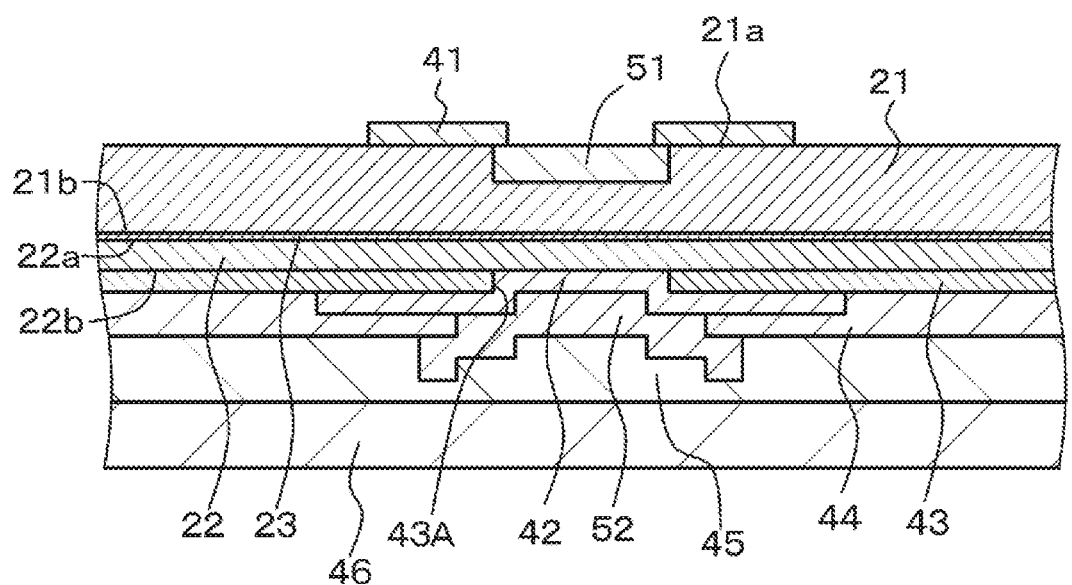

In the example of the surface-emitting laser device shown in FIG. 4A, an end portion of the n-side electrode 41 is spaced apart from the first optical reflective layer 51. On the other hand, in the example of the surface-emitting laser device shown in FIG. 4B, an end portion of the n-side electrode 41 extends to an outer edge of the first optical reflective layer 51. Alternatively, an n-side electrode may be formed such that an end portion of the n-side electrode is in contact with the first optical reflective layer.

Embodiment 7

Figure 6:
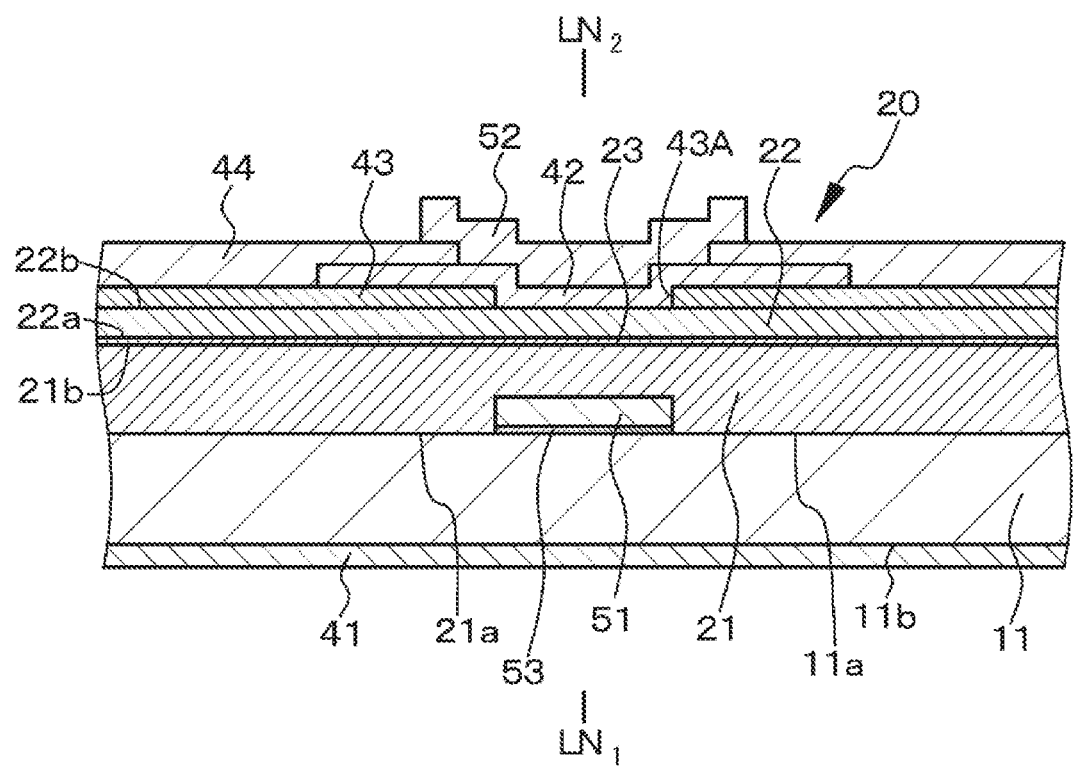
FIG. 6 is a schematic partial sectional view of a surface-emitting laser device of embodiment 7.

Embodiment 7 is a modification of embodiments 5 and 6. FIG. 6 shows a schematic partial sectional view of a surface-emitting laser device of embodiment 7. In the surface-emitting laser device of embodiment 7, the off-angle of the surface orientation of a crystalline surface of a surface 11a of a GaN substrate 11 is within 0.4°, preferably within 0.40°, and the area of the first optical reflective layer 51 is equal to or less than $0.8S_0$ when $S_0$ represents the area of the GaN substrate 11. The lower limit of the area of the first optical reflective layer 51 may be exemplified as, but is not limited to, $0.004 \times S_0$. A thermal expansion mitigation film 53 is formed as a bottom layer of the first optical reflective layer 51 on the GaN substrate 11 or the coefficient of linear thermal expansion (CTE) of the bottom layer (corresponding to the thermal expansion mitigation film 53) of the first optical reflective layer 51 which is in contact with the GaN substrate 11 satisfies the following:

$1 \times 10^{-6}/K \leq CTE \leq 1 \times 10^{-6}/K$, preferably, $1 \times 10^{-6}/K < CTE \leq 1 \times 10^{-5}/K$.

Specifically, the thermal expansion mitigation film 53 (the bottom layer of the first optical reflective layer 51) is made, for example, of silicon nitride ($SiN_x$) that satisfies:

$t_1 = \lambda_0/(2n_1)$.

The thermal expansion mitigation film 53 (the bottom layer of the first optical reflective layer 51) having such a film thickness is transparent to light of a wavelength $\lambda_0$ and does not function as an optical reflective layer. The CTE values of the GaN substrate 11 and silicon nitride ($SiN_x$) are as in Table 6. The CTE values are values at 25° C.

TABLE 6

| |
| --- |
| GaN substrate: $5.59 \times 10^{-6}/K$ |
| Silicon nitride ($SiN_x$): $2.6$-$3.5 \times 10^{-6}/K$ |

To manufacture the surface-emitting laser device of embodiment 7, first, a thermal expansion mitigation film 53 which constitutes the bottom layer of a first optical reflective layer 51 is formed and a remaining portion of the first optical reflective layer 51 which is made of a dielectric multilayer film is formed on the thermal expansion mitigation film 53. Patterning is then performed to obtain the first optical reflective layer 51. Thereafter, the same processes as [Process 510] to [Process 540] of embodiment 5 may be performed.

In embodiment 7, the relationship between the off-angle and the surface roughness Ra of the p-type compound semiconductor layer 22 has been examined. The results are shown in Table 7 below. From Table 7, it is seen that the value of surface roughness Ra of the p-type compound semiconductor layer 22 is high when the off-angle has exceeded 0.4°. That is, by making the off-angle equal to or less than 0.4°, preferably within 0.40°, it is possible to suppress step bunching during growth of the compound semiconductor layer and it is possible to reduce the value of the surface roughness Ra of the p-type compound semiconductor layer 22. As a result, a second optical reflective layer 52 with high flatness can be obtained and it is difficult for variations in the characteristics such as optical reflectance to occur.

TABLE 7

| Off-angle (degrees) | Surface roughness Ra (nm) |
| --- | --- |
| 0.35 | 0.87 |
| 0.38 | 0.95 |
| 0.43 | 1.32 |
| 0.45 | 1.55 |
| 0.50 | 2.30 |

In addition, the relationship between the area $S_0$ of the GaN substrate 11, the area of the first optical reflective layer 51, and the surface roughness Ra of the p-type compound semiconductor layer 22 has been examined. The results are shown in Table 8 below. It is seen from Table 8 that the value of the surface roughness Ra of the p-type compound semiconductor layer 22 can be lowered by making the area of the first optical reflective layer 51 equal to or less than $0.8S_0$.

TABLE 8

| Area of first optical reflective layer 51 | Surface roughness Ra (nm) |
| --- | --- |
| $0.88S_0$ | 1.12 |
| $0.83S_0$ | 1.05 |
| $0.75S_0$ | 0.97 |
| $0.69S_0$ | 0.91 |
| $0.63S_0$ | 0.85 |

From the above results, it is seen that the surface roughness Ra of the p-type compound semiconductor layer 22 (the second surface 22b of the p-type compound semiconductor layer 22) is preferably equal to or less than 1.0 nm.

In addition, manufacturing a surface-emitting laser device having the same configuration and structure as embodiment 7 without forming the thermal expansion mitigation film 53, but with a bottom layer of the first optical reflective layer 51 made of SiOx (CTE: $0.51$-$0.58 \times 10^{-6}/K$), may cause separation of the first optical reflective layer 51 from the GaN substrate 11 during deposition of the laminate structural body 20 depending on the manufacturing conditions. On the other hand, in embodiment 7, separation of the first optical reflective layer 51 from the GaN substrate 11 does not occur during deposition of the laminate structural body 20.

In the surface-emitting laser device of embodiment 7, it is possible to reduce the surface roughness of the p-type compound semiconductor layer since the off-angle of the surface orientation of the crystalline surface of the surface of the GaN substrate and the proportion of the area of the first optical reflective layer are predefined as described above. That is, it is possible to form a p-type compound semiconductor layer with preferable surface morphology. As a result, it is possible to obtain a second optical reflective layer with high flatness and therefore a desired optical reflectance can be obtained and it is difficult for variations in the characteristics of the surface-emitting laser device to occur. In addition, since a thermal expansion mitigation film is formed or the CTE values are predefined, it is possible to avoid the occurrence of the problem of separation of the first optical reflective layer from the GaN substrate due to the difference in the coefficient of linear thermal expansion between the GaN substrate and the first optical reflective layer, and it is thus possible to provide a highly reliable surface-emitting laser device. Further, since the GaN substrate is used, it is difficult for dislocations in the compound semiconductor layer to occur and it is possible to avoid the problem of the increase in the thermal resistance of the surface-emitting laser device. Therefore, it is possible to give high reliability to the surface-emitting laser device and it is also possible to provide an n-side electrode at a side of the GaN substrate (i.e., at a rear surface side of the substrate) different from the side thereof at which the p-side electrode is provided.

Embodiment 8

Embodiment 8 is a modification of embodiment 6. When the thickness of the n-type compound semiconductor layer 21 is large, light may be scattered out of the resonator to be lost when bouncing between the first optical reflective layer 51 and the second optical reflective layer 52, which may cause an increase in the threshold of the surface-emitting laser device and a reduction in the differential efficiency and may further cause problems such as an increase in the operating voltage and a reduction in the reliability. However, reducing the thickness of the n-type compound semiconductor layer 21 through a polishing method often involves difficulties such as wafer cracks and non-uniformity in the resonator length.

Figure 7A:
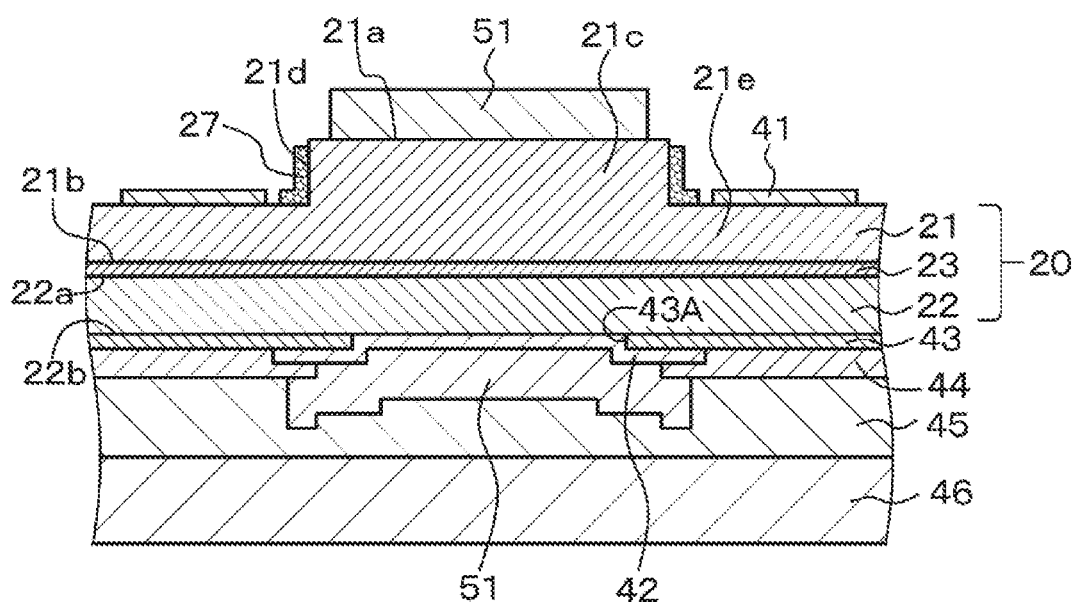
FIGS. 7A and 7B are schematic partial sectional views of a surface-emitting laser device of embodiments 8 and 9, respectively.

In a surface-emitting laser device of embodiment 8, as shown in FIG. 7A which is a schematic partial sectional view thereof, a convex portion 21c is formed on a first surface 21a of the n-type compound semiconductor layer 21, a first optical reflective layer 51 is formed on the convex portion 21c, and an n-side electrode 41 is formed on a concave portion 21e surrounding the convex portion 21c formed on the first surface 21a of the n-type compound semiconductor layer 21. That is, in embodiment 8, the n-type compound semiconductor layer 21 has a so-called mesa shape. The plan shape of the convex portion 21c is a circle. By making the n-type compound semiconductor layer 21 in a mesa shape in this manner, it is possible to prevent light from being scattered out of the resonator when bouncing between the first optical reflective layer 51 and the second optical reflective layer 52 and to eliminate the possibility of the occurrence of problems such as an increase in the operating voltage and a reduction in the reliability.

The plan shape of the n-side electrode 41 is annular (i.e., ring-shaped). The plan shape of the device region is a circle, and the plan shapes of the first optical reflective layer 51, the second optical reflective layer 52, and the opening 43A formed in the current confinement layer 43 are also a circle.

The height of the convex portion 21c is less than the thickness of the n-type compound semiconductor layer 21 and may be equal to or greater than $1 \times 10^{-8}$ m and equal to less than $1 \times 10^{-5}$ m and may be specifically exemplified, for example, as $2 \times 10^{-6}$ m. The size of the convex portion 21c is greater than that of the first optical reflective layer 51 and is also greater than that of the device region.

A dielectric layer 28 made of $SiO_2$, SiN, AlN, $ZrO_2$, $Ta_2O_5$, or the like is formed on a side surface (side wall) 21d of the convex portion 21c, which can more reliably prevent light from being scattered out of the resonator when bouncing between the first optical reflective layer 51 and the second optical reflective layer 52. It is preferable that the refractive index value of the material that constitutes the dielectric layer 28 be smaller than the average refractive index value of the material that constitutes the n-type compound semiconductor layer 21.

The configuration and structure of the surface-emitting laser device of embodiment 8 may be the same as those of the surface-emitting laser device of embodiment 6, except for the points described above, and therefore a detailed description thereof is omitted.

A method of manufacturing a surface-emitting laser device of embodiment 8 will now be described with reference to FIGS. 8A, 8B, 8C, 9A, 9B, and 10 which are schematic partial sectional views of a laminate structural body or the like. In the method of manufacturing a surface-emitting laser device of embodiment 8, first, a laminate structural body 20 is formed on a substrate 11, unlike the method of manufacturing a surface-emitting laser device of embodiment 6. The first optical reflective layer 51 is formed in subsequent processes.

[Process 800]

First, a laminate structural body 20 made by laminating an n-type compound semiconductor layer 21 which is made of a GaN-based compound semiconductor and has a first surface 21a and a second surface 21b opposite to the first surface 21a, an active layer 23 which is made of a GaN-based compound semiconductor and is in contact with the second surface 21b of the n-type compound semiconductor layer 21, and a p-type compound semiconductor layer 22 which is made of a GaN-based compound semiconductor and has a first surface 22a that is in contact with the active layer 23 and a second surface 22b opposite to the first surface 22a is formed on a substrate 11 which is constructed of a GaN substrate on the basis of a well-known MOCVD method. Then, a current confinement layer 43 having an opening 43A is formed on the p-type compound semiconductor layer 22 on the basis of a well-known method. The structure shown in FIG. 8A can be obtained in this manner.

[Process 810]

Then, a p-side electrode 42 and a second optical reflective layer 52 that is made of a dielectric multilayer film are formed on the second surface 22b of the p-type compound semiconductor layer 22. Specifically, a p-side electrode 42 is formed on the second surface 22b of the p-type compound semiconductor layer 22 over the current confinement layer 43, for example, on the basis of a liftoff method and a pad electrode 44 is formed on the p-side electrode 42 over the current confinement layer 43 on the basis of a well-known method. The structure shown in FIG. 8B can be obtained in this manner. Thereafter, a second optical reflective layer 52 is formed on the p-side electrode 42 over the pad electrode 44 on the basis of a well-known method. The structure shown in FIG. 8C can be obtained in this manner.

[Process 820]

Thereafter, the second optical reflective layer 52 is fixed to a support substrate 46 via a bonding layer 45. The structure shown in FIG. 9A can be obtained in this manner.

[Process 830]

Then, the substrate 11 is removed to expose the first surface 21a of the n-type compound semiconductor layer 21. Specifically, first, the thickness of the substrate 11 is reduced on the basis of a mechanical polishing method and then a remaining portion of the substrate 11 is removed on the basis of a CMP method. In addition, the exposed n-type compound semiconductor layer 21 is partially etched in the thickness direction and mirror finishing is performed on the first surface 21a of the n-type compound semiconductor layer 21. The structure shown in FIG. 9B can be obtained in this manner.

[Process 840]

Thereafter, a convex portion 21c and a concave portion 21e are formed on the first surface 21a of the n-type compound semiconductor layer 21, a first optical reflective layer 51 that is made of a dielectric multilayer film is formed on the convex portion 21c, an n-side electrode 41 is formed on the convex portion 21c and the concave portion 21e, and a dielectric layer 28 is formed on a side surface (side wall) 21d of the convex portion 21c.

Specifically, an etching resist layer is formed on the n-type compound semiconductor layer 21 in a region on which the convex portion 21c is to be formed on the basis of a well-known method and then an exposed region of the n-type compound semiconductor layer 21 is etched on the basis of an RIE method to form the convex portion 21c and the concave portion 21e. The structure shown in FIG. 10 can be obtained in this manner. Then, a dielectric layer 28 is formed on a side surface (side wall) 21d of the convex portion 21c using a well-known method.

Then, a first optical reflective layer 51 is formed on the convex portion 21c of the n-type compound semiconductor layer 21 on the basis of a well-known method. Thereafter, an n-side electrode 41 is formed on the concave portion 21e of the n-type compound semiconductor layer 21 on the basis of a well-known method. A surface-emitting laser device of embodiment 8 having the structure shown in FIGS. 7A and 7B can be obtained in this manner.

The order in which the convex portion 21c of the first surface 21a of the n-type compound semiconductor layer 21, the dielectric layer 28, the first optical reflective layer 51, and the n-side electrode 41 are formed is not limited to the order described above. For example, the first optical reflective layer 51, the convex portion 21c of the first surface 21a of the n-type compound semiconductor layer 21, the dielectric layer 28, and the n-side electrode 41 may be formed in this order and the convex portion 21c of the first surface 21a of the n-type compound semiconductor layer 21, the dielectric layer 28, the n-side electrode 41, and the first optical reflective layer 51 may be formed in this order. Essentially, the convex portion 21c of the first surface 21a of the n-type compound semiconductor layer 21, the dielectric layer 28, the first optical reflective layer 51, and the n-side electrode 41 may be formed appropriately in any order.

[Process 850]

Thereafter, the surface-emitting laser device is separated by performing so-called device separation and the side surface or the exposed surface of the laminate structural body is covered, for example, with an insulating film which is made of $SiO_2$ or the like. A terminal or the like is formed on the basis of a well-known method to connect the n-side electrode 41 or the pad electrode 44 to an external circuit or the like and packaging or sealing is performed to complete a surface-emitting laser device of embodiment 8.

Embodiment 9

Figure 7B:
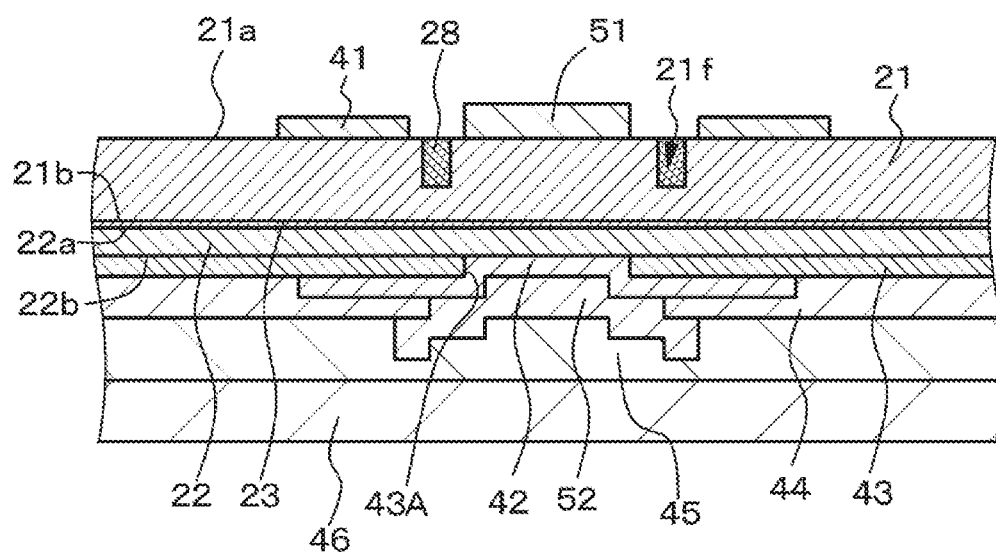
Figure 8A:
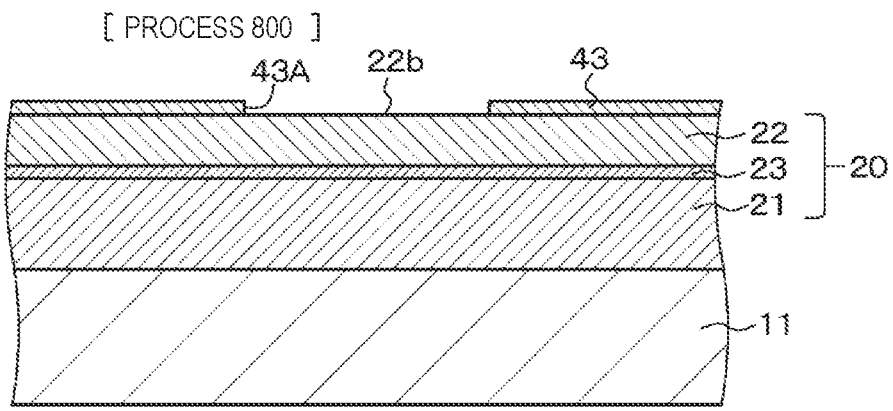
FIGS. 8A, 8B, and 8C are schematic partial sectional views of a laminate structural body or the like for explaining a method of manufacturing a surface-emitting laser device of embodiment 8.
Figure 8B:
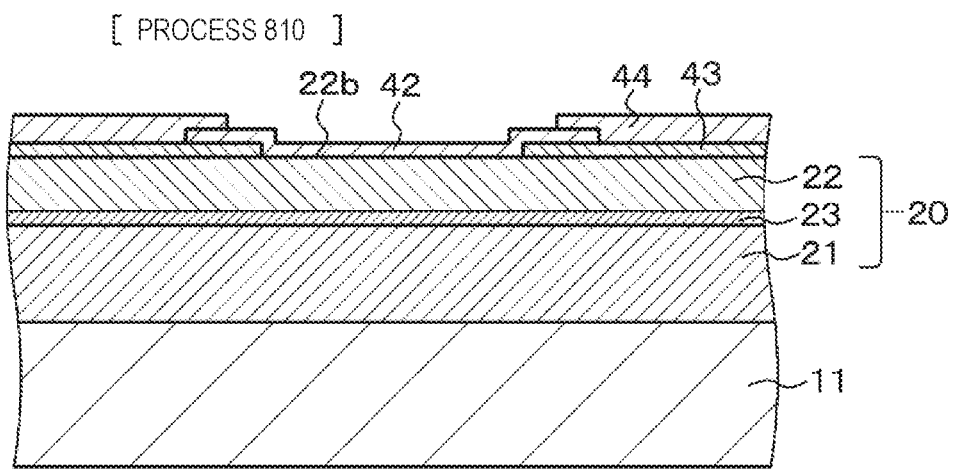
Figure 8C:
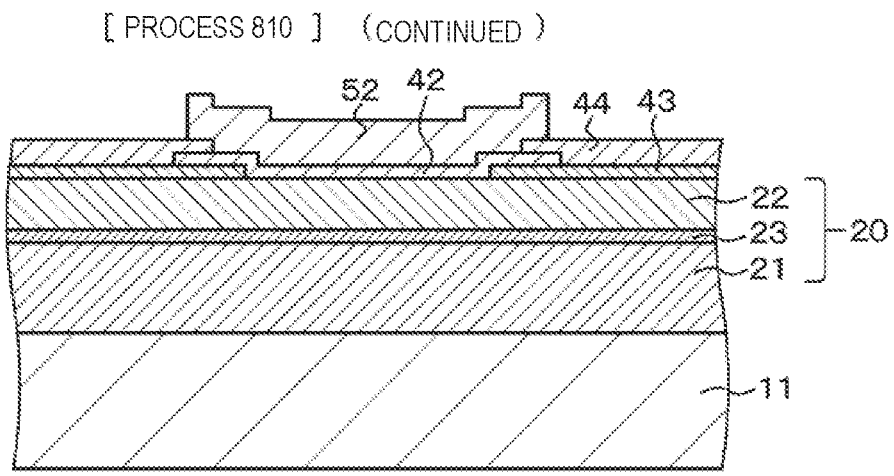

Embodiment 9 is a modification of embodiment 8. As shown in FIG. 7B which is a schematic partial sectional view, an annular groove portion 21f is formed around a first optical reflective layer 51 formed on a first surface 21a of the n-type compound semiconductor layer 21 and the groove portion 21f is filled with an insulating material. That is, an insulating material layer 29 made of $SiO_2$, SiN, AlN, $ZrO_2$, $Ta_2O_5$, or the like is formed in the groove portion 21f. By making the n-type compound semiconductor layer 21 in a mesa shape in this manner, i.e., by filling the annular groove portion 21f with an insulating material, it is possible to prevent light from being scattered out of the resonator when bouncing between the first optical reflective layer 51 and the second optical reflective layer 52 and to eliminate the possibility of the occurrence of problems such as an increase in the operating voltage and a reduction in the reliability.

The depth of the groove portion 21f is less than the thickness of the n-type compound semiconductor layer 21 and may be equal to or greater than $1\times10^{-8}$ m and equal to less than $1\times10^{-5}$ m and may be specifically exemplified, for example, as $2\times10^{-8}$ m. The inner diameter of the groove portion 21f is greater than the first optical reflective layer 51 and is also greater than that of the device region.

The configuration and structure of the surface-emitting laser device of embodiment 9 may be the same as those of the surface-emitting laser device of embodiment 6, except for the points described above, and therefore a detailed description thereof is omitted.

In the same process of the surface-emitting laser device of embodiment 9 as [Process 840] of the surface-emitting laser device of embodiment 8, a groove portion 21f may be formed instead of the convex portion 21c on the first surface 21a of the n-type compound semiconductor layer 21 and an insulating material layer 29 may be formed in the groove portion 21f.

Alternatively, in the same process as [Process 500] of embodiment 5, a groove portion 21f is formed on a substrate (specifically, a GaN substrate) 11 and an insulating material layer 29 is formed in the groove portion 21f, and then a first optical reflective layer 51 is formed on the substrate 11. In the same process as [Process 510] of embodiment 5, an n-type compound semiconductor layer 21, an active layer 23, and a p-type compound semiconductor layer 22 are formed over the entire surface, i.e., over the substrate 11, the first optical reflective layer 51, and the insulating material layer 29 filled into the groove portion 21f, and thereafter the same processes as [Process 520] to [Process 540] of embodiment 5 may be performed. In this case, in the same process as [Process 830] of embodiment 8, the insulating material layer 29 functions as a polishing stopper layer when the substrate 11 has been removed to expose the first surface 21a of the n-type compound semiconductor layer 21 and therefore it is possible to prevent the occurrence of variations of the n-type compound semiconductor layer 21 in the thickness direction thereof.

Embodiment 10

Figure 11A:
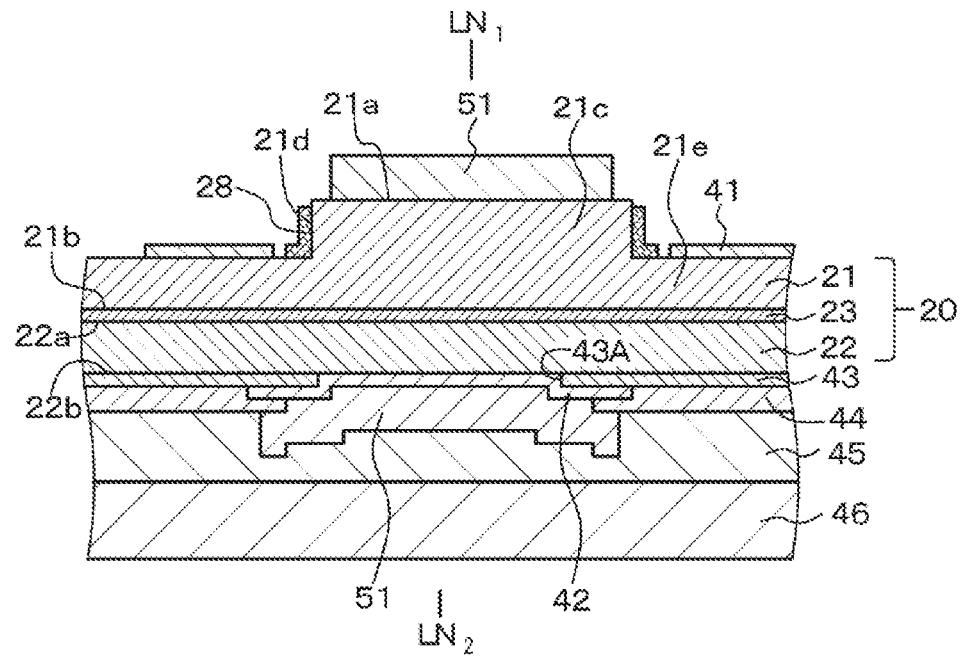
FIGS. 11A and 11B are schematic partial sectional views of a surface-emitting laser device of embodiment 10.
Figure 11B:
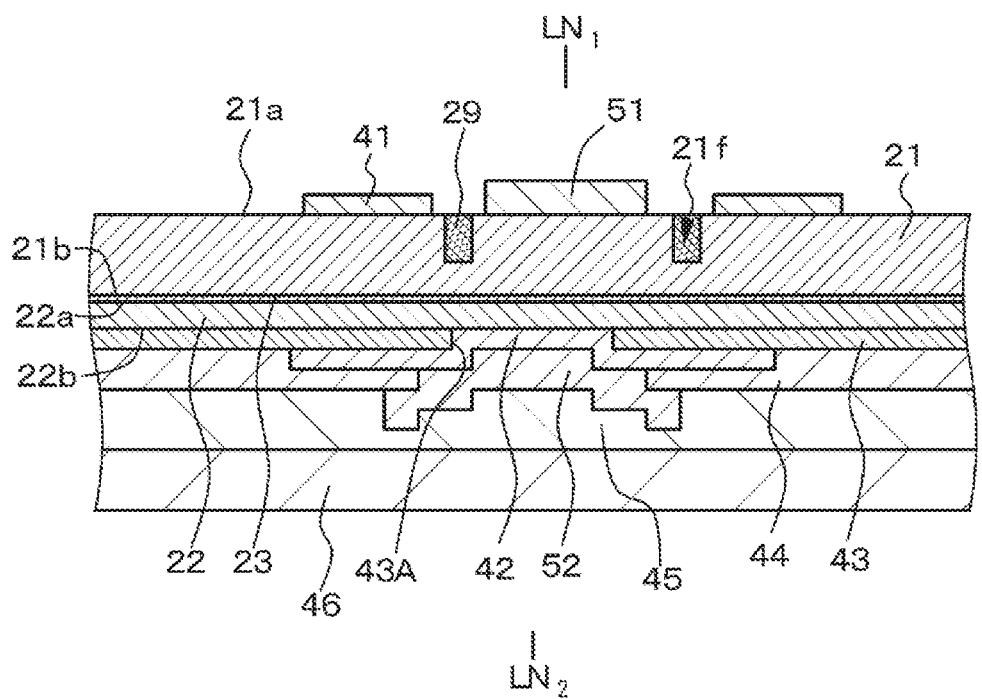
Figure 12:
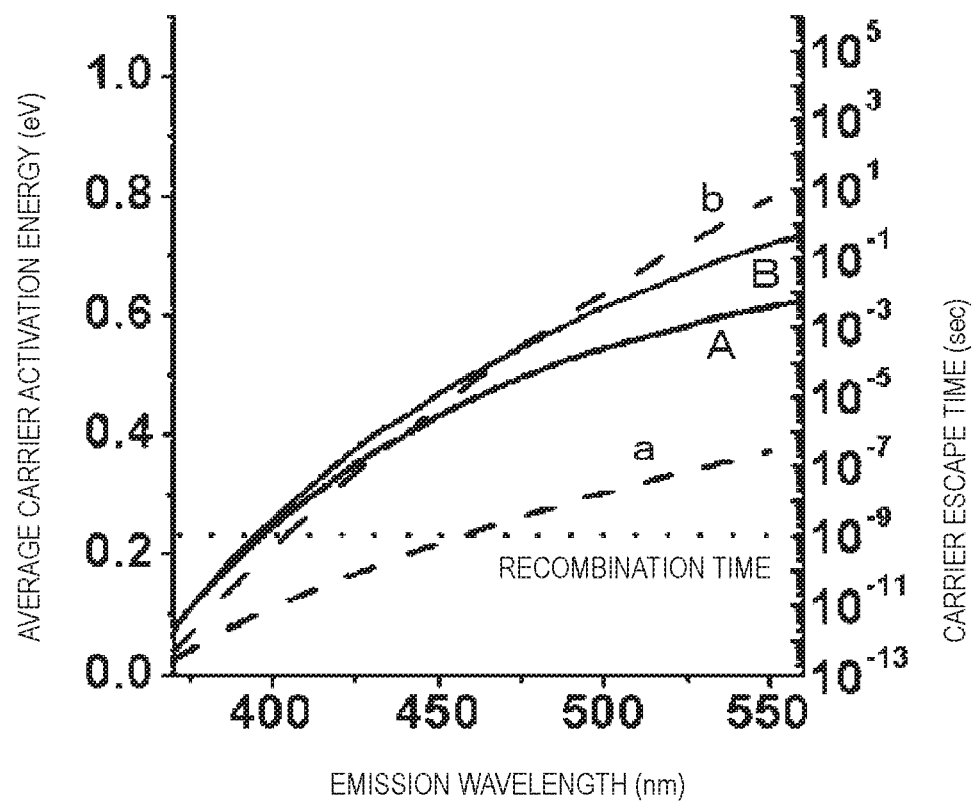
FIG. 12 is a graph illustrating the relationship between an emission recombination time and the time required for a carrier to escape from a well layer.

Embodiment 10 is also a modification of embodiments 8 and 9. As shown in FIGS. 11A and 11B which are schematic partial sectional views, a line $LN_1$ normal to the first optical reflective layer which passes through the center of gravity of the area of the first optical reflective layer does not coincide with a line $LN_2$ normal to the second optical reflective layer which passes through the center of gravity of the area of a portion of the second optical reflective layer which is opposite to the p-type compound semiconductor layer. In other words, the center of gravity of the area of the active layer (specifically, the center of gravity of an area of the active layer that constitutes the device region) is not on the line $LN_1$ normal to the first optical reflective layer which passes through the center of gravity of the area of the first optical reflective layer. The surface-emitting laser device shown in FIG. 11A is a modification of the surface-emitting laser device of embodiment 8 shown in FIG. 7A and the surface-emitting laser device shown in FIG. 11B is a modification of the surface-emitting laser device of embodiment 9 shown in FIG. 7B.

In the surface-emitting laser device, the mode where the optical field intensity at the center of the resonator is maximized (i.e., the fundamental mode) is often the most stable. In the surface-emitting laser device of embodiment 10, the line $LN_1$ normal to the first optical reflective layer 51 which passes through the center of gravity of the area of the first optical reflective layer 51 does not coincide with the line $LN_2$ normal to the second optical reflective layer 52 which passes through the center of gravity of the area of a portion of the second optical reflective layer 52 which is opposite to the p-type compound semiconductor layer 22, or the center of gravity of the area of the active layer 23 is not on the line $LN_1$ normal to the first optical reflective layer 51 which passes through the center of gravity of the area of the first optical reflective layer 51. In other words, the central axis of the mesa shape which serves as a waveguide of the n-type compound semiconductor layer 21 and the central axis of the device region (i.e., the current injection region) are intentionally displaced from each other. Therefore, it is possible to reduce the optical field intensity at the central axis of the resonator, thereby lowering the stability of the fundamental mode. Thereby, it is possible to reduce the stability of the fundamental mode during a high power operation and thus to cause kinking, thereby reducing the upper limit of the optical output of the surface-emitting laser device. Accordingly, this configuration is preferably employed when it is used in applications where it is desirable that the upper limit of the output be limited such as, for example, laser irradiation on a biological body. The offset between the normal line $LN_1$ and the normal line $LN_2$ may be exemplified as 0.01-0.25$1=10$ when $R_0$ represents the diameter of a circle which is assumed to be the plan shape of the device region.

The configuration and structure of the surface-emitting laser device of embodiment 10 may be the same as those of the surface-emitting laser device of embodiments 8 and 9, except for the points described above, and therefore a detailed description thereof is omitted.

Although the present disclosure has been described on the basis of preferred embodiments, the present disclosure is not limited these embodiments. The configurations and structures of the light emitting device described above in the embodiments are exemplary and may be changed as appropriate and the method of manufacturing the light emitting device of the embodiments may also be changed as appropriate.

Additionally, the present technology may also be configured as below.

[A01]<<Optical Semiconductor Device: First Aspect>>

An optical semiconductor device including a laminate structural body in which an n-type compound semiconductor layer, an active layer, and a p-type compound semiconductor layer are laminated in this order, in which the active layer includes a multiquantum well structure including a tunnel barrier layer, and a compositional variation of a well layer adjacent to the p-type compound semiconductor layer is greater than a compositional variation of another well layer.

[A02]

The optical semiconductor device according to [A01], in which band gap energy of the well layer adjacent to the p-type compound semiconductor layer is smaller than band gap energy of the other well layer.

[A03]

The optical semiconductor device according to [A01], in which a thickness of the well layer adjacent to the p-type compound semiconductor layer is greater than a thickness of the other well layer.

[A04]

The optical semiconductor device according to [A03], in which band gap energy of the well layer adjacent to the p-type compound semiconductor layer is smaller than band gap energy of the other well layer.

[A05]

The optical semiconductor device according to any one of [A01] to [A04], in which the tunnel barrier layer is formed between a well layer and a barrier layer.

[B01]<< Optical Semiconductor Device: Second Aspect>>

An optical semiconductor device including a laminate structural body in which an n-type compound semiconductor layer, an active layer, and a p-type compound semiconductor layer are laminated in this order, in which the active layer includes a multiquantum well structure including a tunnel barrier layer, and a band gap energy of a well layer adjacent to the p-type compound semiconductor layer is smaller than a band gap energy of another well layer.

[B02]

The optical semiconductor device according to [B01], in which a thickness of the well layer adjacent to the p-type compound semiconductor layer is greater than a thickness of the other well layer.

[B03]

The optical semiconductor device according to [B01] or [B02], in which the tunnel barrier layer is formed between a well layer and a barrier layer.

[C01] << Optical Semiconductor Device: Third Aspect>>

An optical semiconductor device including a laminate structural body in which an n-type compound semiconductor layer, an active layer, and a p-type compound semiconductor layer are laminated in this order, in which the active layer includes a multiquantum well structure including a tunnel barrier layer, and a thickness of a well layer adjacent to the p-type compound semiconductor layer is greater than a thickness of another well layer.

[C02]

The optical semiconductor device according to [C01], in which the tunnel barrier layer is formed between a well layer and a barrier layer.

[D01]

The optical semiconductor device according to any one of [A01] to [C02], in which a thickness of the tunnel barrier layer is equal to or less than 4 nm.

[D02]

The optical semiconductor device according to any one of [A01] to [D01], in which the active layer is made of an AlInGaN-based compound semiconductor.

[D03]

The optical semiconductor device according to [D02], in which the tunnel barrier layer is made of GaN.

[D04]

The optical semiconductor device according to [D02] or [D03], in which the n-type compound semiconductor layer is formed on a c-surface of a GaN substrate.

[D05]

The optical semiconductor device according to any one of [D02] to [D04], in which an emission wavelength is equal to or greater than 440 nm.

[E01]

The optical semiconductor device according to [D03] or [D04], in which the optical semiconductor device is made of a surface-emitting laser device, the off-angle of a surface orientation of a surface of the GaN substrate is within 0.4°, preferably within 0.40°,
the area of a first optical reflective layer is equal to or less than $0.8S_0$ when $S_0$ represents the area of the GaN substrate, and
a thermal expansion mitigation film is formed as a bottom layer of the first optical reflective layer on the GaN substrate.

[E02]

The optical semiconductor device according to [E01], in which the thermal expansion mitigation film is made of at least one type of material selected from the group consisting of silicon nitride, aluminum oxide, niobium oxide, tantalum oxide, titanium oxide, magnesium oxide, zirconium oxide, and aluminum nitride.

[E03]

The optical semiconductor device according to [E01] or [E02], in which $t_1=\lambda_0/(2n_1)$ is satisfied when $t_1$ represents the thickness of the thermal expansion mitigation film, $\lambda_0$ represents the emission wavelength of the optical semiconductor device, and $n_1$ represents the refractive index of the thermal expansion mitigation film.

[E04]

The optical semiconductor device according to [D03] or [D04], in which the optical semiconductor device is made of a surface-emitting laser device, the off-angle of a surface orientation of a surface of the GaN substrate is within 0.4°, preferably within 0.40°,
the area of a first optical reflective layer is equal to or less than $0.8S_0$ when $S_0$ represents the area of the GaN substrate, and
the coefficient of linear thermal expansion (CTE) of a bottom layer of the first optical reflective layer which is in contact with the GaN substrate satisfies:

$1\times10^{-6}/K \leq CTE \leq 1\times10^{-5}/K$, preferably, $1\times10^{-6}/K < CTE \leq 1\times10^{-5}/K$.

[E05]

The optical semiconductor device according to [E04], in which the bottom layer of the first optical reflective layer is made of at least one type of material selected from the group consisting of silicon nitride, aluminum oxide, niobium oxide, tantalum oxide, titanium oxide, magnesium oxide, zirconium oxide, and aluminum nitride.

[E06]

The optical semiconductor device according to [E04] or [E05], in which $t_1=\lambda_0/(2n_1)$ is satisfied when $t_1$ represents the thickness of the bottom layer of the first optical reflective layer, $\lambda_0$ represents the emission wavelength of the optical semiconductor device, and $n_1$ represents the refractive index of the bottom layer of the first optical reflective layer.

[E07]

The optical semiconductor device according to any one of [E01] to [E06], in which a surface roughness Ra of the p-type compound semiconductor layer is equal to or less than 1.0 nm.

[F01]

The optical semiconductor device according to any one of [D02] to [E07], in which the optical semiconductor device is made of a surface-emitting laser device, and a convex portion is formed on a first surface of the n-type compound semiconductor layer which is opposite to the active layer, the first optical reflective layer is formed on the convex portion, and an n-side electrode is formed on a concave portion surrounding the convex portion formed on the first surface of the n-type compound semiconductor layer.

[F02]

The optical semiconductor device according to [F01], in which a dielectric layer is formed on a side surface of the convex portion.

[F03]

The optical semiconductor device according to [F02], in which the refractive index value of a material that constitutes the dielectric layer is smaller than the average refractive index value of a material that constitutes the n-type compound semiconductor layer.

[F04]

The optical semiconductor device according to any one of [D02] to [E07], in which the optical semiconductor device is made of a surface-emitting laser device, the first optical reflective layer is formed on a first surface of the n-type compound semiconductor layer which is opposite to the active layer, a groove portion is formed on the first surface of the n-type compound semiconductor layer such that the groove portion surrounds the first optical reflective layer, and the groove portion is filled with an insulating material.

[F05]

The optical semiconductor device according to any one of [D02] to [F04], in which the optical semiconductor device is made of a surface-emitting laser device, and a line normal to the first optical reflective layer which passes through a center of gravity of the area of the first optical reflective layer does not coincide with a line normal to the second optical reflective layer which passes through a center of gravity of the area of a portion of the second optical reflective layer which is opposite to the p-type compound semiconductor layer.

[F06]

The optical semiconductor device according to any one of [D02] to [F04], in which the optical semiconductor device is made of a surface-emitting laser device, and a center of gravity of the area of the active layer is not on a line normal to the first optical reflective layer which passes through a center of gravity of the area of the first optical reflective layer.

REFERENCE SIGNS LIST 11 substrate (GaN substrate)
20 laminate structural body
21 n-type compound semiconductor layer
21A n-contact layer
21B n-clad layer
21*a* first surface of n-type compound semiconductor layer 21b second surface of n-type compound semiconductor layer
21c convex portion provided on n-type compound semiconductor layer
21d side surface (side wall) of convex portion
21e concave portion surrounding convex portion
22 p-type compound semiconductor layer
22A electron barrier layer
22B p-clad layer
22C p-contact layer
22a first surface of p-type compound semiconductor layer
22b second surface of p-type compound semiconductor layer
23 active layer
24 insulating layer
25 n-side electrode
26 p-side electrode
27 ridge stripe structure
28 dielectric layer
29 insulating material layer
31, $31_1$, $31_2$ well layers
32 barrier layer
33, $31_1$, $31_2$ tunnel barrier layers
41 n-side electrode
42 p-side electrode
43 current confinement layer
43A opening of current confinement layer
44 pad electrode
45 bonding layer
46 support substrate
51 first optical reflective layer
52 second optical reflective layer
53 expansion mitigation film
54 dielectric film

The invention claimed is:

1. An optical semiconductor device, comprising:
a laminate structural body that comprises:
an n-type compound semiconductor layer;
an active layer;
a p-type compound semiconductor layer, wherein
an order of arrangement is the n-type compound semiconductor layer, the active layer, and the p-type compound semiconductor layer, respectively,
the active layer includes a multiquantum well structure including a first well layer, a first tunnel barrier layer, a first barrier layer, a second tunnel barrier layer, and a second well layer,
the first barrier layer is between the first tunnel barrier layer and the second tunnel barrier layer, and
a compositional variation of the first well layer is greater than a compositional variation of the second well layer;
an electron barrier layer adjacent to the active layer; and
a non-doped compound semiconductor layer between the active layer and the electron barrier layer.

2. The optical semiconductor device according to claim 1, wherein the non-doped compound semiconductor layer is a non-doped InGaN layer.

3. The optical semiconductor device according to claim 1, wherein the non-doped compound semiconductor layer is a non-doped AlGaN layer.

4. The optical semiconductor device according to claim 1, wherein the electron barrier layer is a p-type AlGaN.

* * * * *